United States Patent
Miura et al.

(10) Patent No.: US 10,103,709 B2
(45) Date of Patent: Oct. 16, 2018

(54) CRYSTAL UNIT

(71) Applicant: KYOCERA Crystal Device Corporation, Higashine-shi, Yamagata (JP)

(72) Inventors: Hiroyuki Miura, Higashine (JP); Toshihiro Saito, Higashine (JP); Shinsuke Kawamori, Higashine (JP); Eiji Kimura, Higashine (JP); Katsuhiro Ogasawara, Higashine (JP)

(73) Assignee: KYOCERA CORPORATION, Kyoto-shi (JP)

( * ) Notice: Subject to any disclaimer, the term of this patent is extended or adjusted under 35 U.S.C. 154(b) by 549 days.

(21) Appl. No.: 14/532,656

(22) Filed: Nov. 4, 2014

(65) Prior Publication Data

US 2015/0123515 A1    May 7, 2015

(30) Foreign Application Priority Data

Nov. 5, 2013 (JP) ................. 2013-229076
Apr. 25, 2014 (JP) ................. 2014-091258
May 27, 2014 (JP) ................. 2014-109212

(51) Int. Cl.
*H03H 9/10* (2006.01)
*H03H 9/05* (2006.01)

(52) U.S. Cl.
CPC ........ *H03H 9/1021* (2013.01); *H03H 9/0552* (2013.01)

(58) Field of Classification Search
CPC .................................................. H01L 41/053

(Continued)

(56) References Cited

U.S. PATENT DOCUMENTS 6,229,249 B1 * 5/2001 Hatanaka ................. H03B 5/04
                                                                310/348
2005/0055814 A1    3/2005 Hatanaka et al.
(Continued)

FOREIGN PATENT DOCUMENTS

JP    2000-114877 A    4/2000
JP    2000-269741 A    9/2000
(Continued)

OTHER PUBLICATIONS

Office Action dated Feb. 27, 2018, issued in counterpart Chinese Application No. 201410618084.5, with statement of relevance of non-English references. (8 pages).

*Primary Examiner* — Derek Rosenau
(74) *Attorney, Agent, or Firm* — Westerman, Hattori, Daniels & Adrian, LLP

(57) ABSTRACT

A crystal unit is provided with a rectangular substrate, a frame which is provided on an upper surface of the substrate, a mounting frame which has joining pads which are provided along the outer circumferential edge of the upper surface and which is provided on the lower surface of the substrate by joining joining terminals provided along the outer circumferential edge of the lower surface of the substrate and its joining pads, a crystal element which is mounted on electrode pads which are provided on the upper surface of the substrate in a region surrounded by the frame, a thermosensitive element which is mounted on connection pads which are provided on the lower surface of the substrate in a region surrounded by the mounting frame, and a lid which is joined to the upper surface of the frame.

9 Claims, 23 Drawing Sheets

(58) Field of Classification Search
USPC .................................. 310/340, 344, 346, 348
See application file for complete search history.

(56) References Cited

U.S. PATENT DOCUMENTS

| | | | |
|---|---|---|---|
| 2006/0238080 A1* | 10/2006 | Koyama | ............. H03H 9/1021 |
| | | | 310/348 |
| 2007/0247030 A1* | 10/2007 | Naruse | ................. H03H 9/0552 |
| | | | 310/348 |
| 2011/0234047 A1* | 9/2011 | Muraki | ................... G01K 7/16 |
| | | | 310/315 |
| 2013/0257549 A1 | 10/2013 | Asamura | |

FOREIGN PATENT DOCUMENTS

| | | | |
|---|---|---|---|
| JP | 2004-297209 | A | 10/2004 |
| JP | 2008-028860 | A | 2/2008 |
| JP | 2009-194652 | A | 8/2009 |
| JP | 2010-200102 | A | 9/2010 |
| JP | 2011-211340 | A | 10/2011 |
| JP | 2012-142683 | A | 7/2012 |
| JP | 2012-142691 | A | 7/2012 |
| JP | 2013-102315 | A | 5/2013 |
| JP | 2013-106054 | A | 5/2013 |
| JP | 2013-115753 | A | 6/2013 |

* cited by examiner

CRYSTAL UNIT

TECHNICAL FIELD

The present invention relates to a crystal unit which is used in electronic equipment etc.

BACKGROUND ART

A crystal unit utilizes a piezoelectric effect of a crystal element to generate a specific frequency. For example, there is proposed a crystal unit which is provided with a package which has a substrate, a first frame which is provided on an upper surface of the substrate for providing a first concave portion and a second frame which is provided on a lower surface of the substrate for providing a second concave portion, a crystal element which is mounted on electrode pads which are provided on the upper surface of the substrate, and a thermosensitive element which is provided on the lower surface of the substrate (see for example the following Patent Literature 1).

CITATIONS LIST

Patent Literature 1: Japanese Patent Publication No. 2011-211340A

SUMMARY OF INVENTION

Technical Problem

In the crystal unit which is explained above, the crystal element is mounted in the first concave portion, and the thermosensitive element is mounted in the second concave portion. When such a crystal unit is mounted on a mounting board of electronic equipment or the like, it becomes a state where an opening of the second concave portion is closed by the mounting board. When other electronic parts which are mounted on the mounting board generate heat in that state and that heat is transferred through the mounting board to the interior of the second concave portion, air in the second concave portion is heated up by the heat. That heated air stays in the second concave portion, therefore the temperature around the thermosensitive element sometimes ended up rising. Due to that, the temperature around the crystal element and the temperature around the thermosensitive element become different, therefore the difference between the temperature which was obtained by converting the voltage which was output from the thermosensitive element and the actual temperature around the crystal element was liable to end up becoming larger.

The present invention was made in consideration of the above problem and has as its object is to provide a crystal unit which is capable of reducing the difference between the temperature which is obtained by converting the voltage which is output from the thermosensitive element and the actual temperature around the crystal element.

Solution to Problem

A crystal unit according to one aspect of the present invention has a rectangular substrate, a frame which is provided on an upper surface of the substrate, a mounting frame which is provided on a lower surface of the substrate by joining of joining pads which are provided along the outer circumferential edge of its upper surface with joining terminals which provided along the outer circumferential edge of the lower surface of the substrate, a crystal element which is mounted on an electrode pad which is provided on the upper surface of the substrate in a region surrounded by the frame, a thermosensitive element which is mounted on a connection pad which is provided on the lower surface of the substrate in a region surrounded by the mounting frame, and a lid which is joined to the upper surface of the frame.

Advantageous Effects of Invention

By employing the configuration described above, a clearance portion is provided between the lower surface of the substrate and the upper surface of the mounting frame. Therefore, for example, when the crystal unit of the present invention is mounted on the mounting board of electronic equipment or the like, even when other electronic parts which are mounted on the mounting board generate heat and that heat is transferred through the mounting board to the interior of the second concave portion, air which is heated up by that heat is not accumulated in the second concave portion. Rather, the heated air is discharged to the outside through the clearance portion, and external air enters the second concave portion through the clearance portion. Therefore, the influence of heat upon the thermosensitive element which is mounted in the second concave portion can be mitigated. Accordingly, such a crystal unit can reduce the difference between the temperature which is obtained by converting the voltage which is output from the thermosensitive element and the actual temperature around the crystal unit.

DESCRIPTION OF EMBODIMENTS

Figure 1:
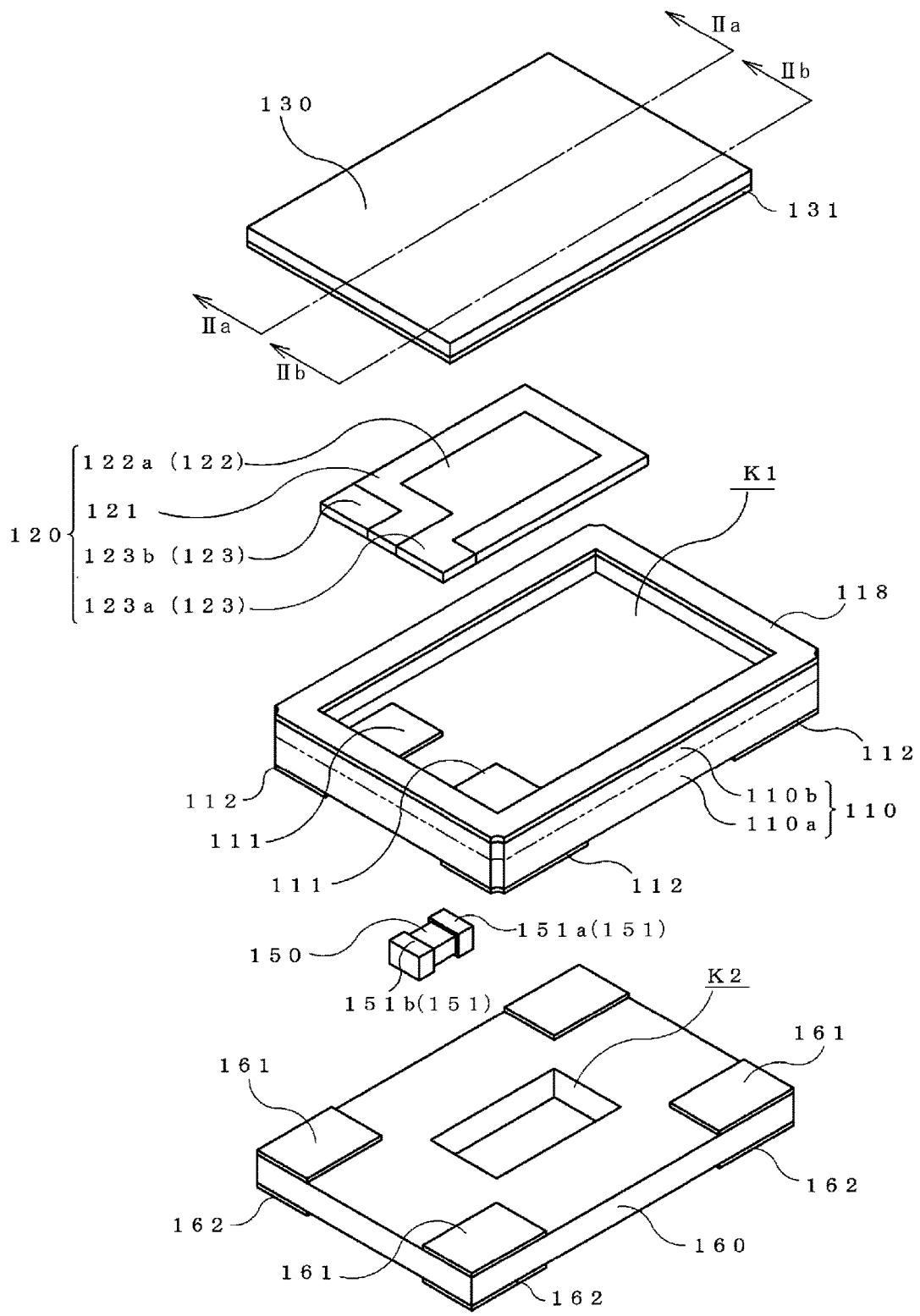
FIG. 1 is a disassembled perspective view which shows a crystal unit according to a first embodiment.

Below, crystal units according to the first to 10th embodiments will be explained with reference to the drawings. Note that, in the second and following embodiments, configurations which are the same as or similar to the configurations of the already explained embodiments will be sometimes assigned the same notations as the notations attached to the configurations of the already explained embodiments, and explanations of them will sometimes be omitted. Further, in the second and following embodiments, configurations which correspond to (are similar) to the configurations of the already explained embodiments are similar to the matters which have been already explained for the corresponding configurations if matters which have not otherwise been indicated even in a case where notations different from the notations attached to the configurations of the already explained embodiments are attached.

First Embodiment

A crystal unit in a first embodiment, as shown in FIG. 1 to FIGS. 5A and 5B, includes a package 110, a crystal element 120 which is joined to an upper surface of the package 110, and a thermosensitive element 150 which is joined to a lower surface of the package 110. In the package 110, a first concave portion K1 which is surrounded by an upper surface of a substrate 110a and inside surfaces of a frame 110b is formed. Further, a second concave portion K2 which is surrounded by a lower surface of the substrate 110a and inside surfaces of a mounting frame 160 is formed. Such a crystal unit is used for outputting a reference signal which is used in electronic equipment etc.

The substrate 110a is rectangular in shape and functions as a mounting member for mounting the crystal element 120 which is mounted on the upper surface and the thermosensitive element 150 which is mounted on the lower surface. On the upper surface of the substrate 110a, electrode pads 111 for mounting the crystal element 120 are provided, while on the lower surface of the substrate 110a, connection pads 115 for mounting the thermosensitive element 150 are provided. Further, along one side of the substrate 110a, a first electrode pad 111a and second electrode pad 111b for joining the crystal element 120 are provided. At the four corners of the lower surface of the substrate 110a, joining terminals 112 are provided. Further, two among the four joining terminals 112 are electrically connected to the crystal element 120. Further, two among the four joining terminals 112 are electrically connected to the thermosensitive element 150. Further, a first joining terminal 112a and a third joining terminal 112c which are electrically connected to the crystal element 120 are provided so as to be diagonally positioned on the lower surface of the substrate 110a. Further, a second joining terminal 112b and a fourth joining terminal 112d which are electrically connected to the thermosensitive element 150 are provided so as to be positioned at diagonal positions of the substrate 110a which are different from the diagonal position at which the first joining terminal 112a and third joining terminal 112c are provided.

The substrate 110a is configured by an insulation layer which is for example made of a ceramic material such as an alumina ceramic or glass ceramic. The substrate 110a may be one which uses one insulation layer or one which is formed by laminating a plurality of insulation layers. On the surface and inside of the substrate 110a, interconnect patterns 113 and via conductors 114 for electrically connecting the electrode pads 111 which are provided on the upper surface and the joining terminals 112 which provided on the lower surface of the substrate 110a are provided. Further, on the surface of the substrate 110a, connection patterns 116 for electrically connecting the connection pads 115 which are provided on the lower surface and the joining terminals 112 which are provided on the lower surface of the substrate 110a are provided.

The frame 110b is arranged along the outer circumferential edge of the upper surface of the substrate 110a and is for forming a first concave portion K1 on the upper surface of the substrate 110a. The frame 110b is made of for example a ceramic material such as an alumina ceramic or glass ceramic and is formed integrally with the substrate 110a.

The electrode pads 111 are for mounting the crystal element 120. The electrode pads 111 are provided in a pair on the upper surface of the substrate 110a and are provided to be adjacent to each other along one side of the substrate 110a. The electrode pads 111, as shown in FIGS. 3A and 3B and FIGS. 4A and 4B, are electrically connected to the joining terminals 112 which are provided on the lower surface of the substrate 110a through the interconnect patterns 113 which are provided on the upper surface of the substrate 110a and via conductors 114.

Figure 3A:
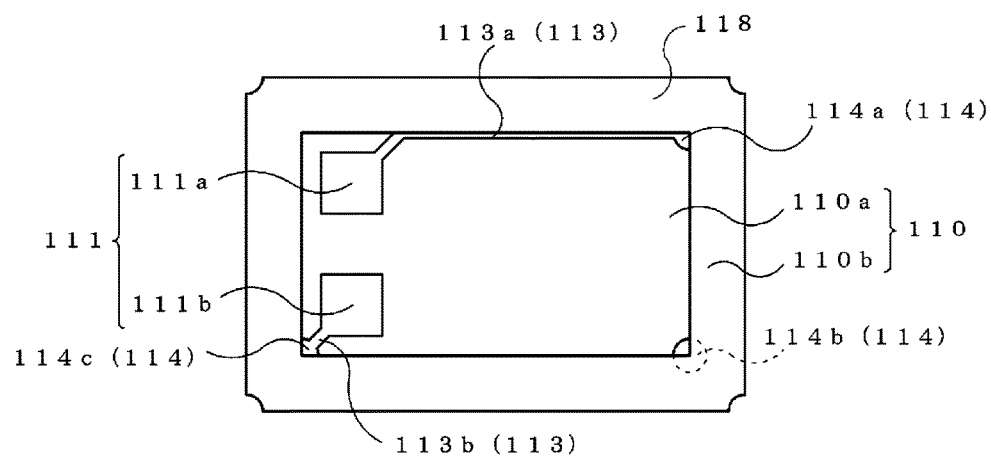
FIG. 3A is a transparent plan view when viewing a package configuring the crystal unit according to the first embodiment from the top surface, and 3B is a transparent plan view when viewing the substrate of the package configuring the crystal unit according to the first embodiment from the top surface.
Figure 3B:
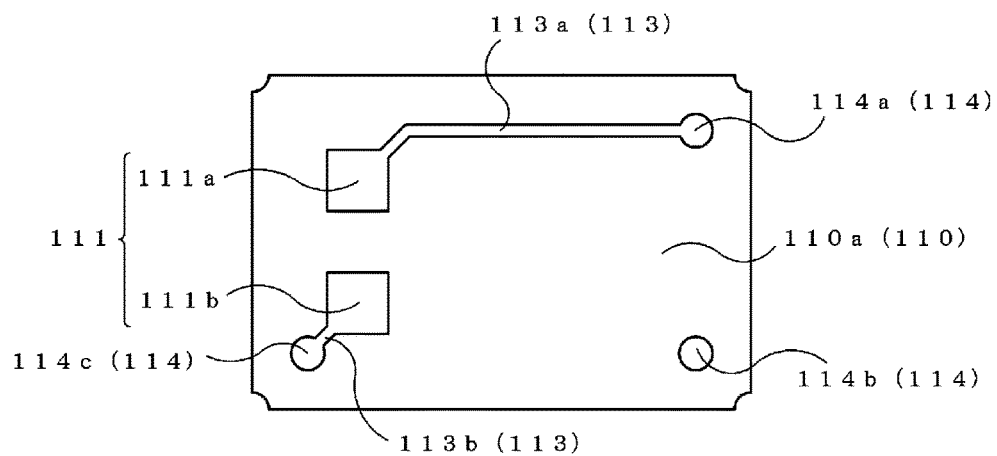
Figure 4A:
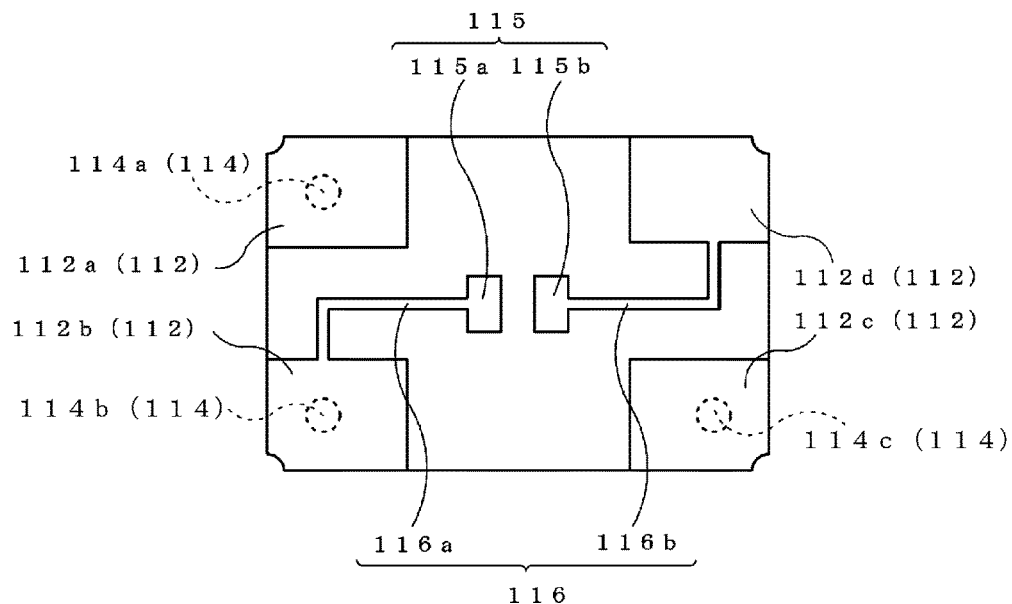
FIG. 4A is a planar transparent view when viewing the substrate of the package which configures the crystal unit according to the first embodiment from the bottom surface, and 4B is a planar transparent view when viewing the package which configures the crystal unit according to the first embodiment from the bottom surface.

The electrode pads 111 are configured by a first electrode pad 111a and a second electrode pad 111b as shown in FIGS. 3A and 3B. Further, the joining terminals 112 are configured by a first joining terminal 112a, second joining terminal 112b, third joining terminal 112c, and fourth joining terminal 112d as shown in FIG. 4A. The via conductors 114 are configured by a first via conductor 114a, second via conductor 114b, and third via conductor 114c. Further, the interconnect patterns 113 are configured by a first interconnect pattern 113a and second interconnect pattern 113b. The first electrode pad 111a is electrically connected to one end of the first interconnect pattern 113a which is provided on the substrate 110a. Further, the other end of the first interconnect pattern 113a is electrically connected to the first joining terminal 112a through the first via conductor 114a. Accordingly, the first electrode pad 111a is electrically connected to the first joining terminal 112a. The second electrode pad 111b is electrically connected to one end of the second interconnect pattern 113b which is provided on the substrate 110a. Further, the other end of the second interconnect pattern 113b is electrically connected through the third via conductor 114c to the third joining terminal 112c.

The joining terminals 112 are used for electrically joining with joining pads 161 of the mounting frame 160. The joining terminals 112 are provided at the four corners of the lower surface of the substrate 110a. Two terminals among the joining terminals 112 are respectively electrically connected to the pair of electrode pads 111 which are provided on the upper surface of the substrate 110a. Further, the joining terminals 112 which are electrically connected to the electrode pads 111 are provided so as to be positioned at the diagonal positions of the lower surface of the substrate 110a. Further, the second joining terminal 112b is electrically connected to a sealing conductor pattern 118 through the second via conductor 114b.

The interconnect patterns 113 are provided on the upper surface of the substrate 110a and are led out from the electrode pads 111 toward the nearby via conductors 114. Further, the interconnect patterns 113 are configured by the first interconnect pattern 113a and second interconnect pattern 113b as shown in FIGS. 3A and 3B.

The via conductors 114 are provided inside of the substrate 110a. Their two ends are electrically connected to the interconnect patterns 113 and connection patterns 116 or the sealing conductor pattern 118. The via conductors 114 are provided by filling conductors inside through holes which are provided in the substrate 110a. Further, the via conductors 114 are configured by first via conductor 114a, second via conductor 114b, and third via conductor 114c as shown in FIGS. 3A and 3B and FIGS. 4A and 4B.

Figure 4B:
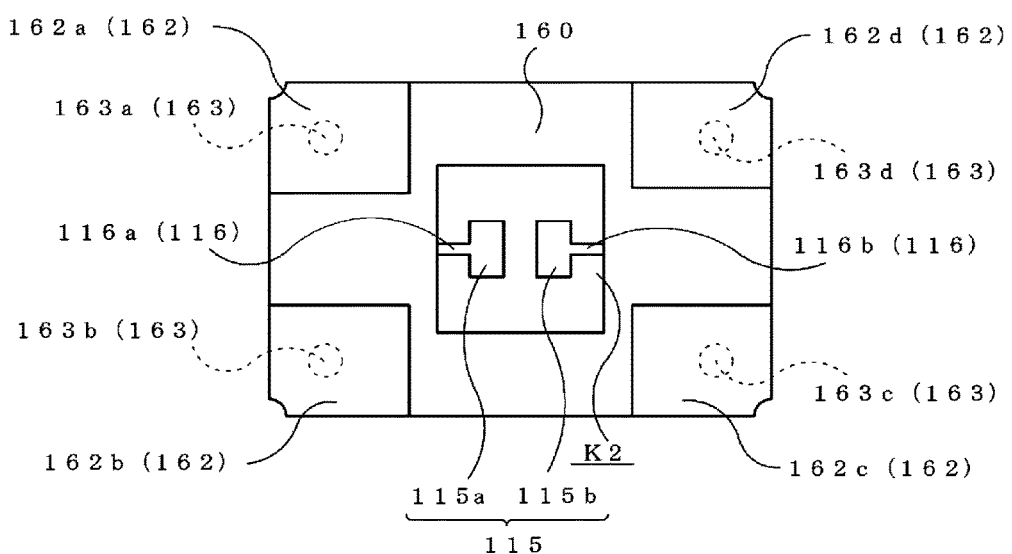

The connection pads 115 are rectangular in shape and are used for mounting the thermosensitive element 150. Further, the connection pads 115 are configured by a first connection pad 115a and second connection pad 115b as shown in FIGS. 4A and 4B. The first connection pad 115a and the second joining terminal 112b are connected by a first connection pattern 116a provided on the lower surface of the substrate 110a, and the second connection pad 115b and the fourth joining terminal 112d are connected by a second connection pattern 116b provided on the lower surface of the substrate 110a.

The connection patterns 116 are provided on the lower surface of the substrate 110a and are led out from the connection pads 115 toward the nearby joining terminals 112. Further, the connection patterns 116 are configured by a first connection pattern 116a and second connection pattern 116b as shown in FIGS. 4A and 4B. The length of the first connection pattern 116a and the length of the second connection pattern 116b become roughly equal. Here, a "roughly equal" length includes a length where a difference between the length of the first connection pattern 116a which is provided on the lower surface of the substrate 110a and the length of the second connection pattern 116b which is provided on the lower surface of the substrate 110a is 0 to 200 μm. The length of each connection pattern 116 is made the measured length of a straight line passing through the center of that connection pattern 116. That is, by the interconnect length of the first connection pattern 116a and the interconnect length of the second connection pattern 116b becoming roughly equal, the generated resistance values become equal and the load resistance which is given to the thermosensitive element 150 becomes uniform, therefore it becomes possible to stably output voltage.

Further, the second connection pattern 116b is provided so as to pass between the pair of electrode pads 111 when viewed on a plane. Further, by configuring the invention in this way, heat which is transferred from the crystal element 120 is transferred from the electrode pads 111 through the substrate 110a located directly under them to the second connection pattern 116b and then to the second joining pad 115b. Accordingly, the crystal unit can further shorten the heat conduction path, therefore the temperature of the crystal element 120 and the temperature of the thermosensitive element 150 become close, so it becomes possible to further reduce the difference between the temperature which is obtained by converting the voltage which is output from the thermosensitive element 150 and the actual temperature around the crystal element 120.

The sealing conductor pattern 118, when joined with the lid 130 through the sealing member 131, plays the role of improving the wettability of the sealing member 131. The sealing conductor pattern 118, as shown in FIGS. 3A and 3B and FIGS. 4A and 4B, is electrically connected through the second via conductor 114b to the second joining terminal 112b. The sealing conductor pattern 118 is formed to a thickness of for example 10 to 25 μm by sequentially applying nickel plating and gold plating to the surface of a conductor pattern made of for example tungsten or molybdenum so as to surround the upper surface of the frame 110b in a ring state.

Here, a method of production of the substrate 110a will be explained. When the substrate 110a is made of alumina ceramic, first a plurality of ceramic green sheets which are obtained by adding and mixing a suitable organic solvent or the like to a predetermined ceramic material powder are prepared. Further, a predetermined conductor paste is coated on the surfaces of the ceramic green sheets or the inside of the through holes, which are formed in advance by punching or otherwise processing the ceramic green sheets, by conventionally known screen printing or the like. Further, these ceramic green sheets are laminated and press-shaped, then fired at a high temperature. Finally, to the predetermined regions of the conductor pattern, specifically regions which become the electrode pads 111, joining terminals 112, interconnect patterns 113, via conductors 114, connection pads 115, connection patterns 116, and the sealing conductor pattern 118, nickel plating, gold plating, silver-palladium, or the like is applied, and thus the substrate is prepared. Further, the conductor paste is comprised of for example a sintered body of metal powder of tungsten, molybdenum, copper, silver, silver-palladium, or the like.

Figure 5A:
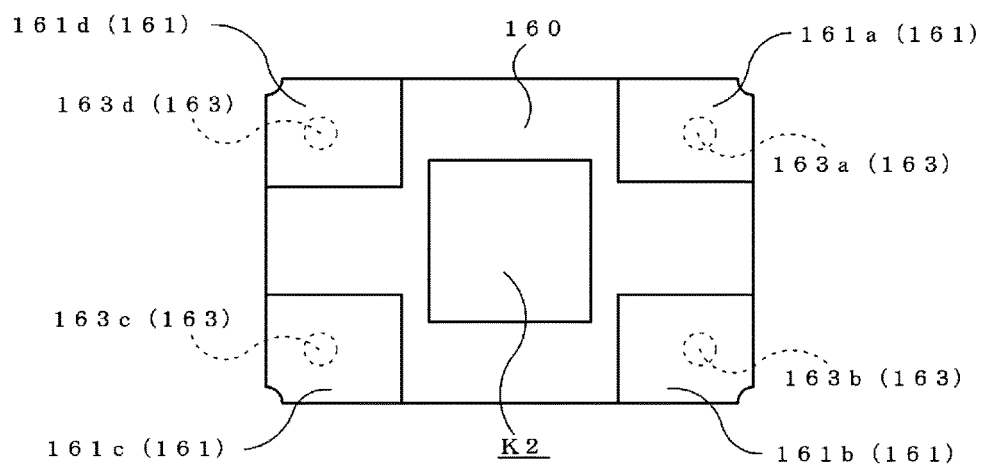
FIG. 5A is a plan view when viewing a mounting frame which configures the crystal unit according to the first embodiment from the top surface, and 5B is a plan view when viewing the mounting frame which configures the crystal unit according to the first embodiment from the bottom surface.
Figure 5B:
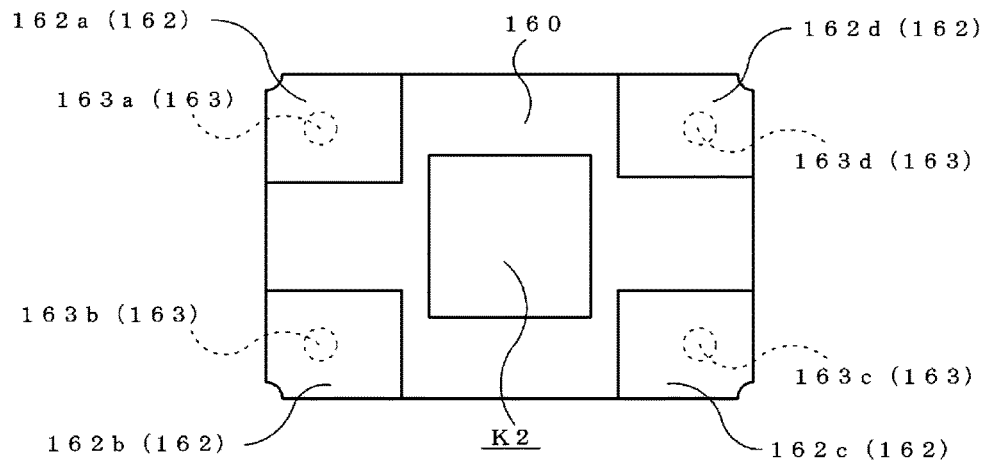

The mounting frame 160 is joined along the outer circumferential edge of the lower surface of the substrate 110a and is for forming the second concave portion K2 on the lower surface of the substrate 110a. The mounting frame 160 is configured by an insulating substrate made of for example glass epoxy resin and is joined with the lower surface of the substrate 110a through a conductive bonding material 170 (first conductive bonding material 170a). Inside the mounting frame 160, as shown in FIGS. 5A and 5B, conductors 163 for electrically connecting the joining pads 161 which are provided on the upper surface and the external terminals 162 which are provided on the lower surface of the mounting frame 160 are provided. At the four corners of the upper surface of the mounting frame 160, joining pads 161 are provided, while the external terminals 162 are provided at the four corners of the lower surface. Further, two among the four external terminals 162 are electrically connected to the crystal element 120 and are used as input-output terminals of the crystal element 120. Further, two among the four external terminals 162 are electrically connected to the thermosensitive element 150. Further, the first external terminal 162a and third external terminal 162c which are electrically connected to the crystal element 120 are provided so as to be positioned diagonally on the lower surface of the mounting frame 160. Further, the second external terminal 162b and fourth external terminal 162d which are electrically connected to the thermosensitive element 150 are provided so as to be positioned at diagonal positions which are different from the diagonal positions at which the first external terminal 162a and third external terminal 162c which are connected to the crystal element 120 are provided.

The joining pads 161 are for electrical bonding with the joining terminals 112 of the substrate 110a through the conductive bonding material 170. The joining pads 161, as shown in FIG. 5A, are configured by a first joining pad 161a, second joining pad 161b, third joining pad 161c, and fourth joining pad 161d. Further, the external terminals 162, as shown in FIG. 5B, are configured by a first external terminal 162a, second external terminal 162b, third external terminal 162c, and fourth external terminal 162d. The conductors 163 are configured by a first conductor 163a, second conductor 163b, third conductor 163c, and fourth conductor 163d. The first joining pad 161a is electrically connected through the first conductor 163a to the first external terminal 162a, and the second joining pad 161b is electrically connected through the second conductor 163b to the second external terminal 162b. The third joining pad 161c is electrically connected through the third conductor 163c to the third external terminal 162c, and the fourth joining pad 161d is electrically connected through the fourth conductor 163d to the fourth external terminal 162d.

The external terminals 162 are for mounting on the mounting board of electronic equipment or the like. The external terminals 162 are provided at the four corners of the lower surface of the mounting frame 160. Two terminals among the external terminals 162 are respectively electrically connected to the pair of electrode pads 111 which are provided on the upper surface of the substrate 110a. The remaining two terminals among the external terminals 162 are electrically connected to the pair of connection pads 115 provided on the lower surface of the substrate 110a. Further, the second external terminal 162b is connected to the mounting pad which is connected to the ground potential as the reference potential on the mounting board of the electronic equipment or the like. Due to this, the lid 130 joined to the sealing conductor pattern 118 is connected to the second external terminal 162b which has become the ground potential. Accordingly, a shielding property in the first concave portion K1 by the lid 130 is improved.

The conductors 163 are for electrically connecting the joining pads 161 on the upper surface of the substrate 110a and the external terminals 162 on the lower surface. They are formed by providing through holes at the four corners of the mounting frame 160, forming conductive members on the inner wall surfaces of the through holes, closing the top surfaces of those by the joining pads 161, and closing the bottom surfaces of those by the external terminals 162.

The shape of the opening of the second concave portion K2 becomes rectangular when viewed on a plane. Here, the size of the opening of the second concave portion K2 will be explained by taking as example a case where the dimension of the long sides of the substrate 110a on a plane is 1.2 to 2.5 mm, and the dimension of the short sides of the substrate 110a is 1.0 to 2.0 mm when viewed on a plane. The length of the long sides of the second concave portion K2 is 0.6 to 1.2 mm, and the length of the short sides of the second concave portion becomes 0.3 to 1.0 mm.

A bonding method of the mounting frame 160 to the substrate 110a will be explained. First, the conductive bonding material 170 (first conductive bonding material 170a) is coated on the first joining pad 161a, second joining pad 161b, third joining pad 161c, and fourth joining pad 161d by for example a dispenser or screen printing. The substrate 110a is conveyed so that the joining terminals 112 of the substrate 110a are positioned over the conductive bonding material 170 and then is placed on the conductive bonding material 170. Then, the conductive bonding material 170 is cured and made to shrink by heat curing. Due to this, the joining terminals 112 of the substrate 110a are joined to the joining pads 161. That is, the first joining terminal 112a of the substrate 110a is joined to the first joining pad 161a, and the second joining terminal 112b of the substrate 110a is joined to the second joining pad 161b. Further, the third joining terminal 112c of the substrate 110a is joined to the third joining pad 161c, and the fourth joining terminal 112d of the substrate 110a is joined to the fourth joining pad 161d.

Figure 2A:
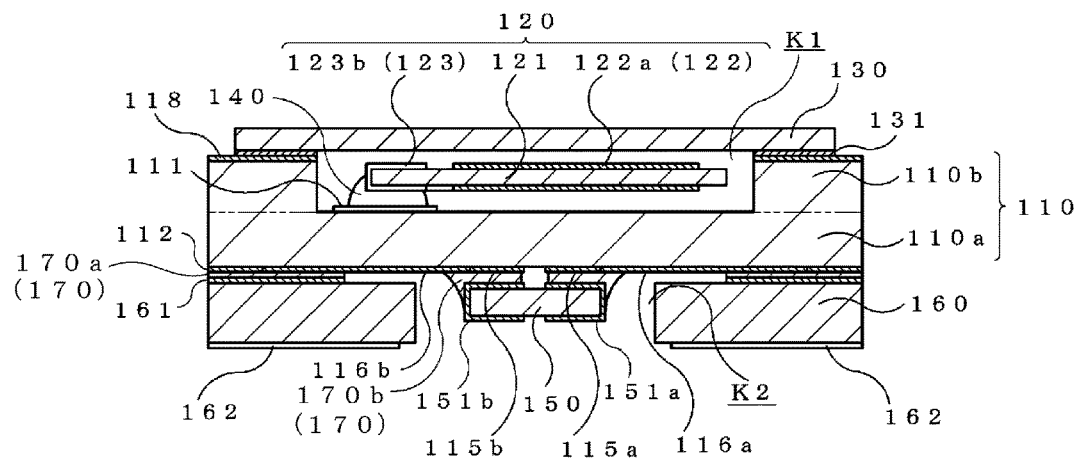
FIG. 2A is a cross-sectional view taken along IIa-IIa in FIGS. 1, and 2B is a cross-sectional view taken along IIb-IIb in FIG. 1.
Figure 2B:
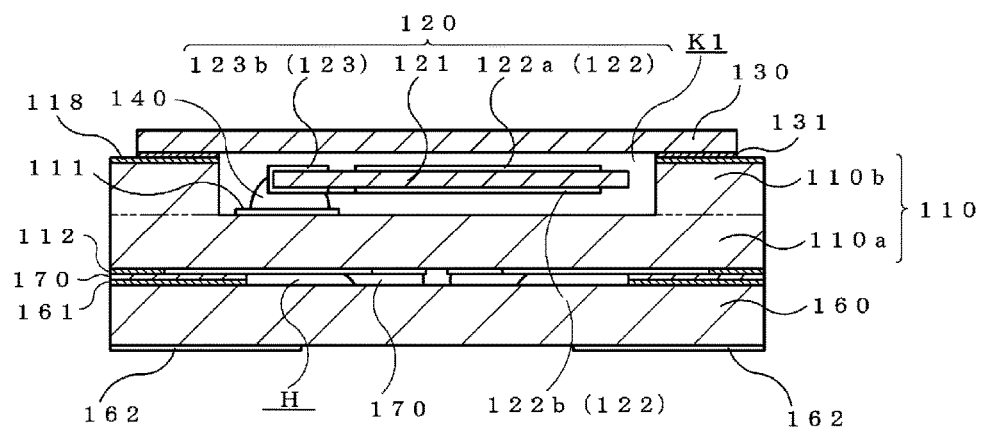

Further, by bonding of the joining terminals 112 of the substrate 110a and the joining pads 161 of the mounting frame 160 through the conductive bonding material 170, as shown in FIG. 2B, a clearance portion H having a thickness of an extent obtained by adding the thickness of the conductive bonding material 170 and the thicknesses of the joining terminals 112 and joining pads 161 is provided between the substrate 110a and the mounting frame 160. Due to this, for example, when the crystal unit of the present embodiment is mounted on the mounting board of electronic equipment or the like, even when another electronic equipment such as a power amplifier which is mounted on this mounting board generates heat and that heat is transferred through the mounting board to the interior of the second concave portion K2, air which is heated up by that heat is not accumulated in the second concave portion K2, the heated air is discharged to the outside through the clearance portion H, and external air enters into the second concave portion K2 through the clearance portion H, therefore the influence of heat in the second concave portion K2 with respect to the thermosensitive element 150 can be mitigated. Accordingly, such a crystal unit can reduce the difference between the temperature which is obtained by converting the voltage which is output from the thermosensitive element 150 and the actual temperature around the crystal element 120.

Here, a method of production of the mounting frame 160 will be explained. When the mounting frame 160 is a glass epoxy resin, it is produced by impregnating a precursor of epoxy resin into a base material made of glass fiber and heat curing this epoxy resin precursor at a predetermined temperature. Further, the predetermined regions of the conductor pattern, specifically the joining pads 161 and external terminals 162, are for example formed by transferring a copper foil formed to a predetermined shape to a resin sheet made of glass epoxy resin, laminating resin sheets to which the copper foil has been transferred, and bonding them by an adhesive. Further, the conductors 163 are formed by depositing metal on the inner surfaces of the through holes which are formed the resin sheets by printing a conductor paste or plating, or are formed by filling metal in the through holes. Such conductors 163 are for example formed by joining metallic foil or metal columns by resin molding or deposition by using the sputtering method, vapor deposition method, or the like.

The crystal element 120 is, as shown in FIG. 1 and FIGS. 2A and 2B, joined onto the electrode pads 111 through a conductive adhesive 140. The crystal element 120 plays a role of generating a reference signal of an electronic apparatus or the like by stable mechanical vibration and a piezoelectric effect.

Further, the crystal element 120 has a structure such as shown in FIG. 1 and FIGS. 2A and 2B in which excitation-use electrodes 122 and leadout electrodes 123 are attached to the upper surface and lower surface of a crystal element plate 121. The excitation-use electrodes 122 are formed by depositing metal to each of the upper surface and lower surface of the crystal element plate 121 by predetermined patterns. The excitation-use electrodes 122 are provided with a first excitation-use electrode 122a on the upper surface and a second excitation-use electrode 122b on the lower surface. The leadout electrodes 123 are extended from the excitation-use electrodes 122 toward one side of the crystal element plate 121. The leadout electrodes 123 are provided with a first leadout electrode 123a on the upper surface and a second leadout electrode 123b on the lower surface. The first leadout electrode 123a is led out from the first excitation-use electrode 122a and is provided so as to extend toward one side of the crystal element plate 121. The second leadout electrode 123b is led out from the second excitation-use electrode 122b and is provided so as to extend toward one side of the crystal element plate 121. That is, the leadout electrodes 123 are provided in shapes along the long sides or short sides of the crystal element plate 121. Further, in the present embodiment, the crystal element 120 is fixed onto the substrate 110a by a cantilever supporting structure in which one end of the crystal element 120 which is connected to the first electrode pad 111a and second electrode pad 111b is defined as the fixed end connected to the upper surface of the substrate 110a, and the other end is defined as the free end separated from the upper surface of the substrate 110a.

Here, the operation of the crystal element 120 will be explained. The crystal element 120 is designed so that when an alternating voltage from the outside is applied from the leadout electrodes 123 through the excitation-use electrodes 122 to the crystal element plate 121, the crystal element plate 121 causes excitation at a predetermined vibration mode or frequency.

Here, a method of production of the crystal element 120 will be explained. First, the crystal element 120 is cut from a manmade crystal at a predetermined cut angle and is beveled making the thickness of the periphery of the crystal element plate 121 thinner so that the center portion of the crystal element plate 121 becomes thicker than the periphery of the crystal element plate 121. Then, the crystal element 120 is produced by forming excitation-use electrodes 122 and leadout electrodes 123 by depositing metal films on the two major surfaces of the crystal element plate 121 by a photolithography technique, vapor deposition technique, or sputtering technique.

A bonding method of the crystal element 120 to the substrate 110a will be explained. First, the conductive adhesive 140 is for example coated on the first electrode pad 111a and second electrode pad 111b by a dispenser. The crystal element 120 is conveyed over the conductive adhesive 140 and then is placed on the conductive adhesive 140. Then, the conductive adhesive 140 is cured and made to shrink by heat curing. The crystal element 120 is thereby bonded to the electrode pads 111. That is, the first leadout electrode 123a of the crystal element 120 is bonded to the second electrode pad 111b, and the second leadout electrode 123b is bonded to the first electrode pad 111a. Due to this, the first joining terminal 112a and the third joining terminal 112c are electrically connected to the crystal element 120.

The conductive adhesive 140 is comprised of silicone resin or another binder in which a conductive filler constituted by conductive powder is contained. As the conductive powder, use is made of any of aluminum, molybdenum, tungsten, platinum, palladium, silver, titanium, nickel, and nickel iron or one containing a combination of the same. Further, as the binder, use is made of for example a silicone resin, epoxy resin, polyimide resin, or bismaleimide resin.

As the thermosensitive element 150, use is made of a thermistor, platinum resistance temperature detector, diode etc. In the case of a thermistor element, the thermosensitive element 150 is box shaped and is provided with connection terminals 151 on its two ends. In the thermosensitive element 150, the electric resistance remarkably changes along with a change in temperature. The voltage changes due to the change of the resistance value. Therefore, from the relationship between the resistance value and the voltage and the relationship between the voltage and temperature, temperature information can be obtained from the output voltage. The voltage between the connection terminals 151 of the thermosensitive element 150 which will be explained later is output through the second external terminal 162b and fourth external terminal 162d to the outside of the crystal unit. Therefore, the temperature information can be obtained by converting the output voltage to the temperature by for example a main IC (not shown) of electronic equipment or the like. By arranging such a thermosensitive element 150 near the crystal unit and controlling the voltage for driving the crystal unit by the main IC in accordance with the temperature information of the crystal unit obtained by this, so-called temperature compensation can be carried out.

Further, when use is made of a platinum resistance temperature detector, in the thermosensitive element 150, platinum is vapor-deposited at the center on a box shaped ceramic plate whereby a platinum electrode is provided. Further, connection terminals 151 are provided on the two ends of the ceramic plate. The platinum electrode and the connection terminals are connected by leadout electrodes which provided on the upper surface of the ceramic plate. An insulating resin is provided so as to cover the upper surface of the platinum electrode.

Further, when use is made of a diode, the thermosensitive element 150 has a structure in which a semiconductor element is mounted on the upper surface of a semiconductor element-use substrate, and the upper surfaces of the semiconductor element and semiconductor element-use substrate are covered by an insulating resin. From the lower surface to the side surfaces of the semiconductor element-use substrate, connection terminals 151 which become an anode terminal and cathode terminal are provided. The thermosensitive element 150 has a forward characteristic that it makes current flow from the anode terminal to the cathode terminal, but makes allows almost no current to flow from the cathode terminal to the anode terminal. The forward characteristic of the thermosensitive element greatly changes according to the temperature. By measuring the forward voltage while making a constant current flow through the thermosensitive element, voltage information can be obtained. By conversion from that voltage information, the temperature information of the crystal element 120 can be obtained. The diode has a straight line relationship between the voltage and temperature. The voltage between the cathode terminal and the anode terminal of the connection terminals 151 is output through the second joining terminal 112b and fourth joining terminal 112d to the outside of the crystal unit.

The thermosensitive element 150 is, as shown in FIGS. 2A and 2B, mounted on the connection pads 115 which is provided on the lower surface of the substrate 110a through a conductive bonding material 170 (second conductive bonding material 170b) such as solder. Further, the first connection terminal 151a of the thermosensitive element 150 is connected to the first connection pad 115a, and the second connection terminal 151b is connected to the second connection pad 115b. The first connection pad 115a is connected through the first connection pattern 116a which is provided on the lower surface of the substrate 110a to the second joining terminal 112b. The second joining terminal 112b is electrically connected through the conductive bonding material 170 (first conductive bonding material 170a) to the second joining pad 161b. The second joining pad 161b is electrically connected through the second conductor 163b to the second external terminal 162b. Accordingly, the first connection pad 115a is electrically connected through the second joining terminal 112b to the second external terminal 162b. This second external terminal 162b plays a role of a ground terminal by connection with the mounting pad which is connected to the ground as the reference potential on the mounting board of the electronic equipment or the like. Accordingly, the first connection terminal 151a of the thermosensitive element 150 is connected to the ground which has the reference potential.

Further, by positioning the thermosensitive element 150 in the plane of the excitation-use electrodes 122 provided on the crystal element 120 when viewed on a plane, due to a shield effect by the metal films of the excitation-use electrodes 122, the thermosensitive element 150 is protected from noise from a power amplifier or other semiconductor parts or electronic parts configuring the electronic equipment. Accordingly, due to the shield effect of the excitation-use electrodes 122, superposition of noise on the thermosensitive element 150 is reduced, therefore a correct voltage of the thermosensitive element 150 can be output. Further, since a correct voltage value can be output from the thermosensitive element 150, it becomes possible to further reduce the difference between the temperature information obtained by converting the voltage which is output from the thermosensitive element 150 and the information of the actual temperature around the crystal element 120.

The bonding method of the thermosensitive element 150 to the substrate 110a will be explained. First, the conductive bonding material 170 (second conductive bonding material 170b) is for example coated on the connection pads 115 by a dispenser. The thermosensitive element 150 is placed on the conductive bonding material 170. Then, the conductive bonding material 170 is melt-bonded by heating. Accordingly, the thermosensitive element 150 is bonded to the pair of connection pads 115.

Further, when the thermosensitive element 150 is a thermistor element, as shown in FIG. 1 and FIGS. 2A and 2B, the connection terminals 151 are respectively provided on the two ends of the box shape. The first connection terminal 151a is provided on the right side surface and upper and lower surfaces of the thermosensitive element 150. The second connection terminal 151b is provided on the left side surface and upper and lower surfaces of the thermosensitive element 150. The length of the long sides of the thermosensitive element 150 is 0.4 to 0.6 mm, and the length of the short sides becomes 0.2 to 0.3 mm. The length in the thickness direction of the thermosensitive element 150 becomes 0.1 to 0.3 mm.

The conductive bonding material 170 is comprised of for example a silver paste or lead-free solder. Further, the conductive bonding material 170 contains a solvent which is added for adjustment to a viscosity facilitating coating. Use is made of a lead-free solder having a ratio of composition of 95 to 97.5% of tin, 2 to 4% of silver, and 0.5 to 1.0% of copper.

The lid 130 is configured by for example an alloy containing at least one of iron, nickel, and cobalt. Such a lid 130 is for air-tight sealing of the first concave portion K1 in a vacuum state or the first concave portion K1 filled with nitrogen gas or the like. Specifically, in a predetermined atmosphere, the lid 130 is placed on the frame 110b of the package 110, a predetermined current is applied and seam welding is executed so that the sealing conductor pattern 118 of the frame 110b and the sealing member 131 of the lid 130 are welded together, thereby the lid 130 is bonded to the frame 110b. Further, the lid 130 is electrically connected through the sealing conductor pattern 118 and second via conductor 114b to the second joining terminal 112b on the lower surface of the substrate 110a. The second joining terminal 112b is electrically connected through the conductive bonding material 170 to the second joining pad 161b and is electrically connected through the first connection pattern 116a to the first connection pad 115a. The second joining pad 161b is electrically connected through the second conductor 163b to the second external terminal 162b. Accordingly, the lid 130 is electrically connected to the second external terminal 162b of the mounting frame 160 and is electrically connected to the first connection terminal 151a of the thermosensitive element 150.

The sealing member 131 is provided at the location of the lid 130 which faces the sealing conductor pattern 118 which is provided on the upper surface of the frame 110b of the package 110. The sealing member 131 is provided by for example silver solder or Au—Sn. In the case of silver solder, its thickness is 10 to 20 μm. For example, use is made of a member having a ratio of composition of 72 to 85% of silver and 15 to 28% of copper. In the case of Au—Sn, its thickness is 10 to 40 μm. For example, use is made of a member having a ratio of composition of 78 to 82% of gold and 18 to 22% of tin.

The crystal unit in the present embodiment is provided with the rectangular substrate 110a, the frame 110b which provided on the upper surface of the substrate 110a, and the mounting frame 160 which has joining pads 161 which are provided along the outer circumferential edge of the upper surface and which is provided on the lower surface of the substrate 110a by bonding of the joining terminals 112 which are provided along the outer circumferential edge of the lower surface of the substrate 110a and the joining pads 161. By configuring the unit in this way, a clearance portion H is provided between the lower surface of the substrate 110a and the upper surface of the mounting frame 160. Therefore, for example, in the case where the crystal unit of the present invention is mounted on a mounting board of electronic equipment or the like, even when other electronic parts which are mounted on that mounting board generate heat and that heat is transferred through the mounting board to the interior of the second concave portion K2, air heated up by that heat is not accumulated in the second concave portion K2, the heated air is discharged to the outside through the clearance portion H, and the external air enters into the second concave portion K2 through the clearance portion H, therefore the influence of heat with respect to the thermosensitive element 150 which is mounted in the second concave portion K2 can be mitigated. Accordingly, such a crystal unit can reduce the difference between the temperature which is obtained by converting the voltage which is output from the thermosensitive element 150 and the actual temperature around the crystal element 120.

Further, the crystal unit in the present embodiment, in a state mounting the crystal element 120 and thermosensitive element 150 on the substrate 110a, positions the thermosensitive element 150 in the plane of the excitation-use electrodes 122 provided on the crystal element 120 when viewed on a plane thereby protects the thermosensitive element 150 from noise from the power amplifier and other semiconductor parts or electronic parts configuring the electronic equipment by the shield effect by the metal films of the excitation-use electrodes 122. Accordingly, due to the shield effect of the excitation-use electrodes 122, superposition of noise on the thermosensitive element 150 is reduced, therefore a correct voltage of the thermosensitive element 150 can be output. Further, since a correct voltage value can be output from the thermosensitive element 150, it becomes possible to further reduce the difference between the temperature information which is obtained by converting the voltage which is output from the thermosensitive element 150 and the information of the actual temperature around the crystal element 120.

Further, the crystal unit in the present embodiment is provided with connection patterns 116 for electrically connecting the connection pads 115 and the joining terminals 112 (external terminals 162). The electrode pads 111 are provided along one side of the inner circumferential edge of the frame 110b so as to be adjacent to each other as a pair. One of the connection patterns 116 is provided so as to be positioned between the pair of electrode pads 111 when viewed on a plane. By configuring the unit in this way, the heat which is transferred from the crystal element 120 is transferred from the electrode pads 111 through the substrate 110a located just under them to the second connection pattern 116b and to the second connection pad 115b. Accordingly, such a crystal unit can shorten the heat conduction path, therefore the temperature of the crystal element 120 and the temperature of the thermosensitive element 150 end up becoming closer and thus it becomes possible to further reduce the difference between the temperature which is obtained by converting the voltage which is output from the thermosensitive element 150 and the actual temperature around the crystal element 120.

Second Embodiment

Figure 6A:
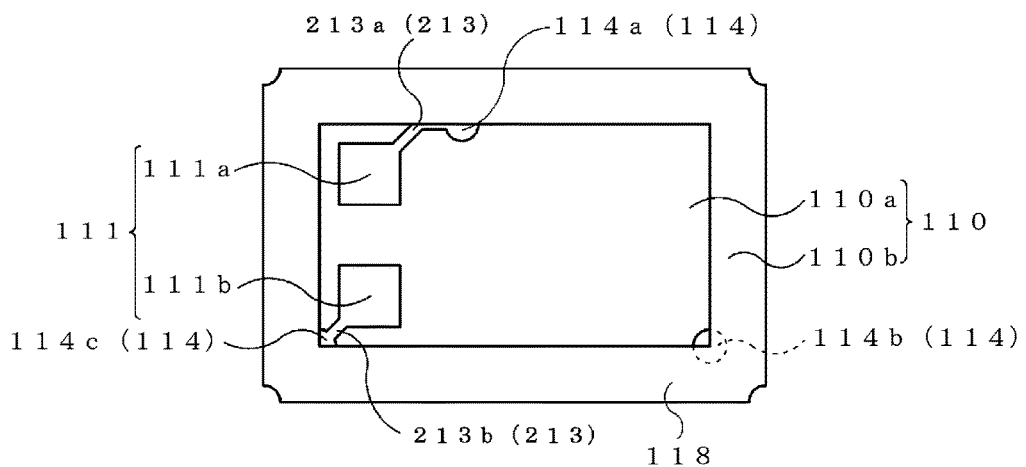
FIG. 6A is a transparent plan view when viewing a package which configures a crystal unit according to a second embodiment from the top surface, and 6B is a transparent plan view when viewing the substrate of the package which configures the crystal unit according to the second embodiment from the top surface.
Figure 6B:
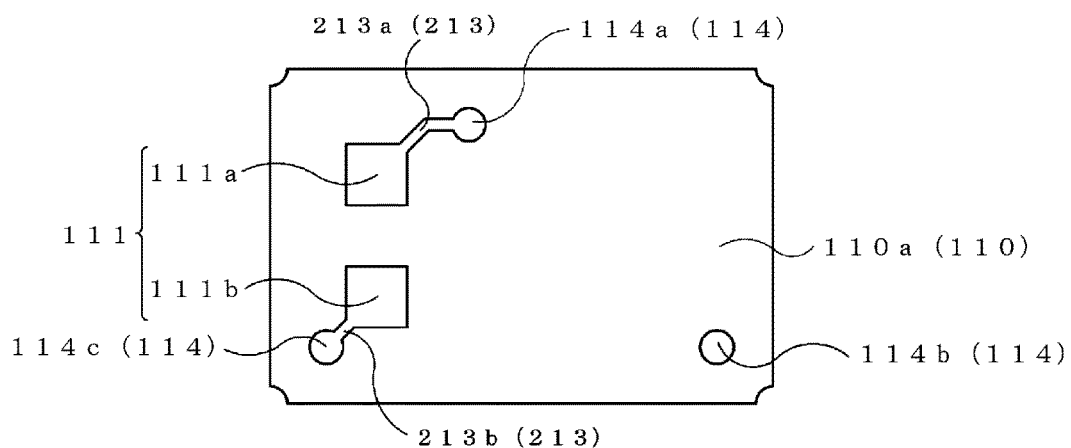
Figure 7:
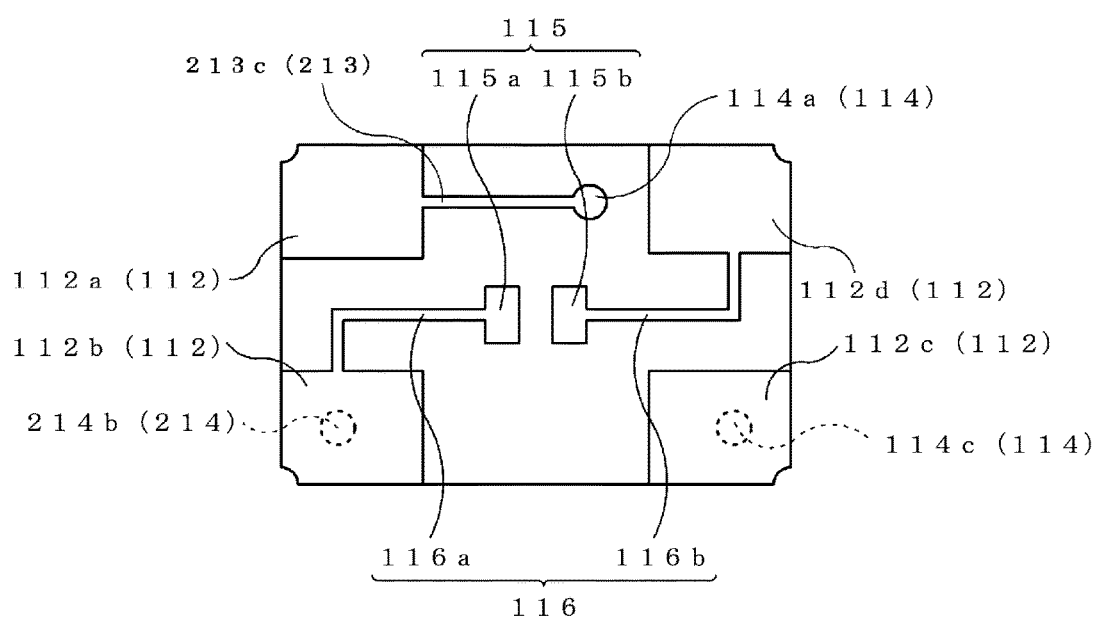
FIG. 7 is a planar transparent view when viewing the substrate of the package which configures the crystal unit according to the second embodiment from the bottom surface.

A crystal unit in a second embodiment is, as shown in FIGS. 6A and 6B and FIG. 7, provided with interconnect patterns 213 for electrically connecting electrode pads 111 and connection terminals 112. One of the interconnect patterns 213 is provided on the same plane as that for the connection pads 115 and is provided at a position where it overlaps the mounting frame 160.

The interconnect patterns 213 are configured by a first interconnect pattern 213a, second interconnect pattern 213b, and third interconnect pattern 213c. The first electrode pad 111a is electrically connected to one end of the first interconnect pattern 213a which is provided on the substrate 110a. Further, the other end of the first interconnect pattern 213a is electrically connected through the first via conductor 114a to one end of the third interconnect pattern 213c. The other end of the third interconnect pattern 213c is electrically connected to the first joining terminal 112a. Accordingly, the first electrode pad 111a is electrically connected to the first joining terminal 112a. The second interconnect pattern 213b is the same as the first interconnect pattern 113b in the first embodiment.

The third interconnect pattern 213c is provided on the lower surface of the substrate 110a and is provided close to the connection pads 115 of the substrate 110a. That is, the interval between the third interconnect pattern 213c and the connection pad 115b is 50 to 100 μm. By configuring the unit in this way, heat which is transferred from the crystal element 120 is transferred from the electrode pad 111 through the first interconnect pattern 213a and first via conductor 114a to the third interconnect pattern 213c. Next, heat which is transferred from the crystal element 120 is transferred from the third interconnect pattern 213c through the lower surface of the substrate 110a to the connection pads 115. Accordingly, the crystal unit can shorten the heat conduction path, therefore the temperature of the crystal element 120 and the temperature of the thermosensitive element 150 become close, so it becomes possible to reduce the difference between the temperature which is obtained by converting the voltage which is output from the thermosensitive element 150 and the actual temperature around the crystal element 120.

Further, the third interconnect pattern 213c is provided at a position overlapping the mounting frame 160. By configuring the unit in this way, when mounting the crystal unit in the present embodiment on the mounting board of electronic equipment or the like, a floating capacitance which is generated between an interconnect conductor which is provided on that mounting board and the third interconnect pattern 213c can be reduced. Accordingly, fluctuation of the oscillation frequency of the crystal element 120 can be reduced while suppressing addition of the floating capacitance to the crystal element 120. Note that, since the third interconnect pattern 213c overlaps the mounting frame 160, a planar transparent view when viewing the package of the crystal unit in the present embodiment from the bottom surface is the same as FIG. 4B.

The crystal unit in the present embodiment is provided with interconnect patterns 213 for electrically connecting the electrode pads 111 and the joining terminals 112. The third interconnect pattern 213c is provided on the same plane as that for the connection pads 115 and is provided at a position where it overlaps the mounting frame 160. By configuring the unit in this way, heat which is transferred from the crystal element 120 is transferred from the electrode pad 111 through the first interconnect pattern 213a and first via conductor 114a to the third interconnect pattern 213c. Next, heat which is transferred from the crystal element 120 is transferred from the third interconnect pattern 213c through the lower surface of the substrate 110a to the connection pads 115. Accordingly, the crystal unit can shorten the heat conduction path, therefore the temperature of the crystal element 120 and the temperature of the thermosensitive element 150 become close, and thus it becomes possible to reduce the difference between the temperature which is obtained by converting the voltage which is output from the thermosensitive element 150 and the actual temperature around the crystal element 120.

Further, in the crystal unit in the present embodiment, the third interconnect pattern 213c is provided at a position where it overlaps the mounting frame 160. By configuring the unit in this way, when mounting the crystal unit of the present embodiment on the mounting board of electronic equipment or the like, a floating capacitance generated between an interconnect conductor provided on that mounting board and the third interconnect pattern 213c can be reduced. Accordingly, fluctuation of the oscillation frequency of the crystal element 120 can be reduced while suppressing addition of the floating capacitance to the crystal element 120.

Third Embodiment

Figure 8A:
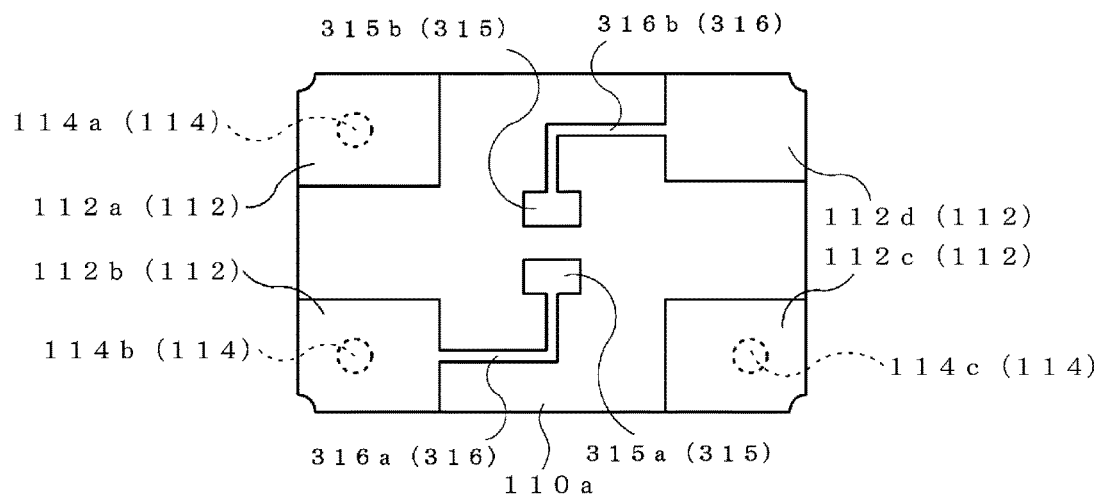
FIG. 8A is a planar transparent view when viewing a substrate of a package which configures a crystal unit according to a third embodiment from the bottom surface, and 8B is a planar transparent view when viewing the package which configures the crystal unit according to the third embodiment from the bottom surface.
Figure 8B:
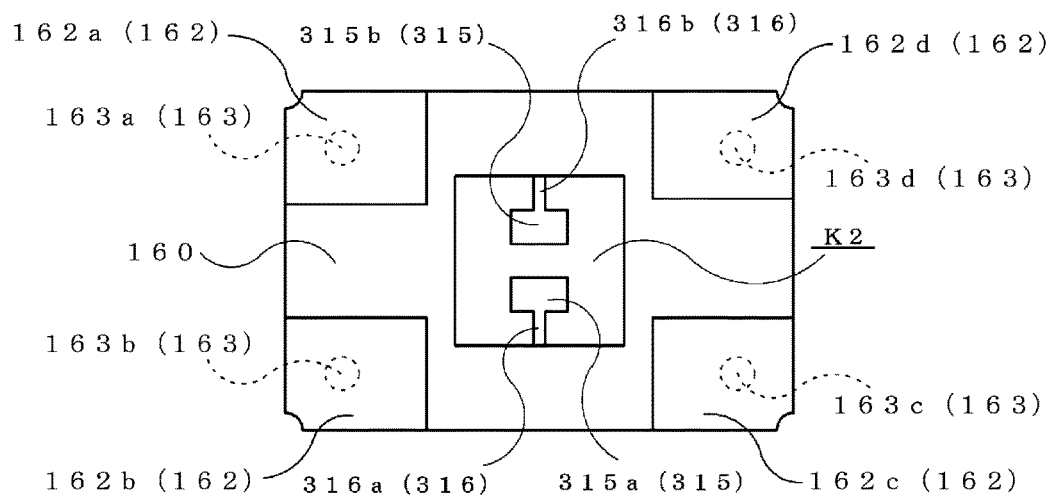

A crystal element in a third embodiment, as shown in FIGS. 8A and 8B, differs from the first embodiment in the point that the thermosensitive element 150 is mounted on connection pads 315 of a substrate 110a so that its long sides become parallel to the short sides of the substrate 110a.

The connection pads 315 are rectangular in shape and are provided near the center of the lower surface of the substrate 110a. The connection pads 315 are provided so as to be adjacent to each other so that the long sides of the connection pads 315 and the long sides of the substrate 110a become parallel as shown in FIGS. 8A and 8B. The connection pads 315 are configured by a first connection pad 315a and second connection pad 315b. Connection patterns 316 (316a and 316b) are provided on the lower surface of the substrate 110a and are led out from the connection pads 315 toward the nearby joining terminals 112.

The thermosensitive element 150 is mounted on the lower surface of the substrate 110a so that the long sides of the thermosensitive element 150 and the short sides of the substrate 110a become parallel. By configuring the unit in this way, the first joining terminal 112a which is electrically connected to the crystal element 120 can be increased in interval from the first connection pad 315a, and the third joining terminal 112c which is electrically connected to the crystal element 120 can be increased in interval from the second connection pad 315b. Therefore, even if the conductive bonding material 170 which bonds the thermosensitive element 150 overflows, deposition of the conductive bonding material 170 can be suppressed. Accordingly, short-circuiting between the thermosensitive element 150 and the joining terminals 112 which are electrically connected to the crystal element 120 can be reduced.

Fourth Embodiment

Figure 9A:
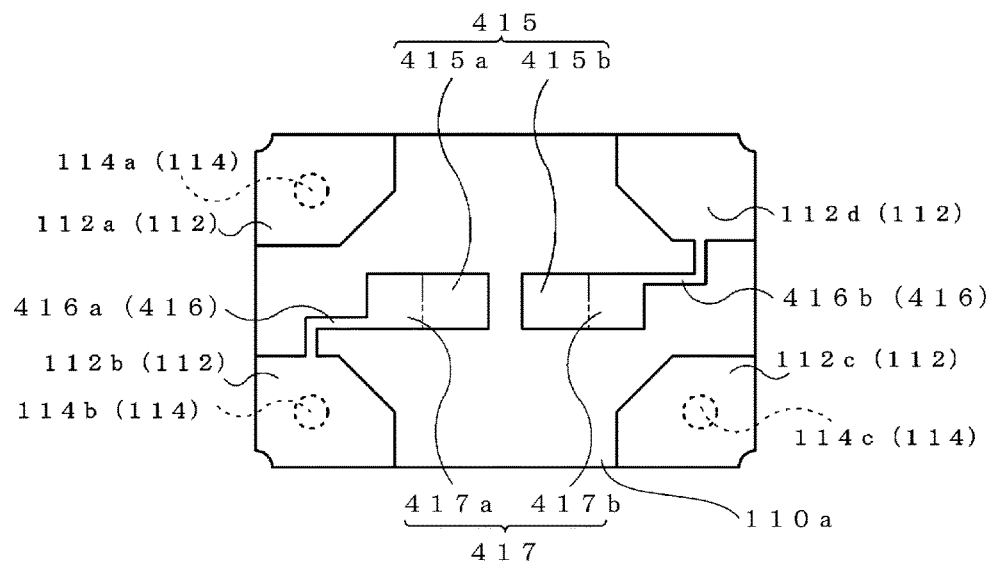
FIG. 9A is a planar transparent view when viewing a substrate of a package which configures a crystal unit according to a fourth embodiment from the bottom surface and 9B is a planar transparent view when viewing the package which configures the crystal unit according to the fourth embodiment from the bottom surface.
Figure 9B:
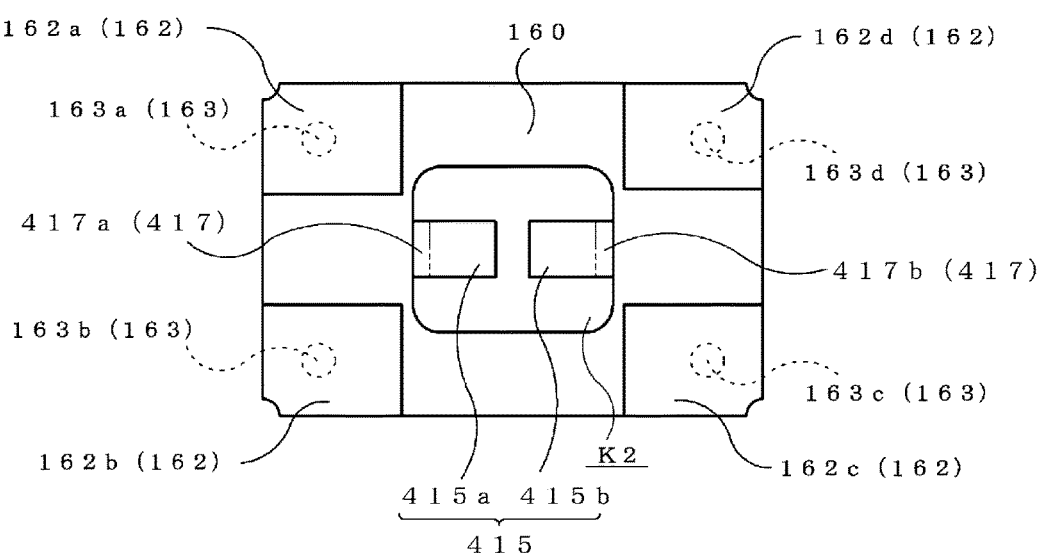
Figure 10:
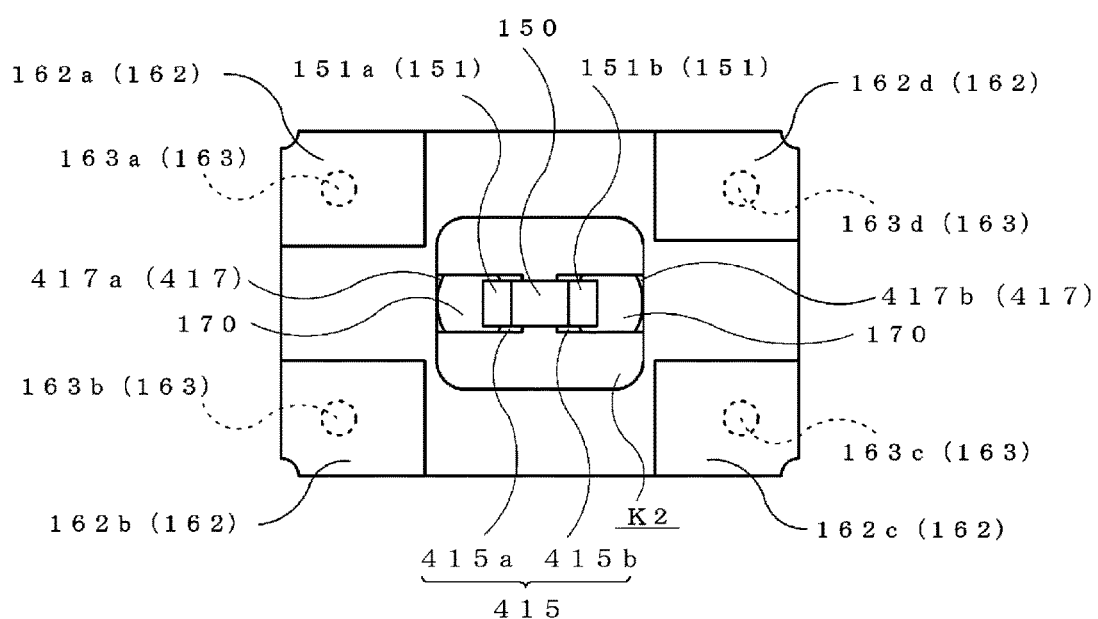
FIG. 10 is a plan view when viewing the crystal unit according to the fourth embodiment from the bottom surface.

A crystal element in a fourth embodiment, as shown in FIGS. 9A and 9B and FIG. 10, differs from the first embodiment in the point that mounting pads 417 are provided between connection pads 415 and connection patterns 416. Note that, the shape of the joining terminals 112, the shape of the second concave portion K2, and so on differ from those in the first embodiment as well, but the same notations will be attached and an explanation will be omitted.

The mounting pads 417 are rectangular in shape and are used for mounting the thermosensitive element 150 and securing the amount of the conductive bonding material 170. An inclination is formed in the conductive bonding material 170 so that the thickness gradually increases from the mounting pads 417 toward the connection terminals 151 of the thermosensitive element 150. That is, a fillet of the conductive bonding material 170 is formed on the mounting pads 417. By formation of the fillet in this way, the bonding strength of the thermosensitive element 150 with the connection pads 415 and the mounting pads 417 can be improved.

Further, a second mounting pad 417b is provided so as to be positioned between a pair of electrode pads 111 (FIG. 1 to FIGS. 3A and 3B). Further, by configuring the unit in this way, heat which is transferred from the crystal element 120 will be transferred from the electrode pads 111 through the substrate 110a which is located just under the former to the second mounting pad 417b and further to the second connection pad 415b. Accordingly, such a crystal unit can further shorten the heat conduction path, therefore the temperature of the crystal element 120 and the temperature of the thermosensitive e element 150 become closer, and thus it becomes possible to further reduce the difference between the temperature which is obtained by converting the voltage which is output from the thermosensitive element 150 and the actual temperature around the crystal element 120.

Here, by taking as an example a case where the dimension of the long sides of the substrate 110a is 1.2 to 2.5 mm and the dimension of the short sides of the substrate 110a is 1.0 to 2.0 mm when viewed on a plane, sizes of the connection pads 415 and mounting pads 417 will be explained. The lengths of the sides of the connection pads 415 which are parallel to the short sides of the substrate 110a are 0.2 to 0.5 mm, and the lengths of the sides of the connection pads 415 which are parallel to the long sides of the substrate 110a are 0.25 to 0.55 mm. The lengths of the sides of the mounting pads 417 which are parallel to the short sides of the substrate 110a are 0.2 to 0.5 mm, and the lengths of the sides of the mounting pads 417 which are parallel to the long sides of the substrate 110a are 0.1 to 0.4 mm. In this way, the length of one side of a mounting pad 417 which faces the center direction of the substrate 110a becomes the same as the length of one side of a connection pad 415 which faces the center direction of the substrate 110a. Accordingly, the conductive bonding material 170 is bonded from the connection pads 415 toward the mounting pads 417 as shown in FIG. 10 when viewed on a plane. Therefore, compared with the conventional crystal unit, the bonding area of the conductive bonding material 170 becomes larger, so it becomes possible to improve the bonding strength. Further, the length between the first connection pad 415a and the second connection pad 415b has become 0.1 to 0.3 mm.

The first connection pad 415a and first mounting pad 417a are connected with the second joining terminal 112b by a first connection pattern 416a which is provided on the lower surface of the substrate 110a. Further, the second connection pad 415b and second mounting pad 417b are connected with the fourth joining terminal 112d by a second connection pattern 416b which is provided on the lower surface of the substrate 110a.

The second connection pattern 416b is provided so as to overlap the first electrode pad 111a when viewed on a plane. By configuring the unit in this way, heat which is transferred from the crystal element 120 is transferred from the first electrode pad 111 through the substrate 110a which is located just under the former to the second connection pattern 416b and further to the second mounting pad 417b and second connection pad 415b. Accordingly, such a crystal unit further shortens the heat conduction path and further increases the number of heat conduction paths, so the temperature of the crystal element 120 and the temperature of the thermosensitive element 150 end up becoming closer, and thus it becomes possible to further reduce the difference between the temperature which is obtained by converting the voltage which is output from the thermosensitive element 150 and the actual temperature around the crystal element 120.

The method of production of the substrate 110a is the same as the first embodiment except that the mounting pads 417 are formed in the same way as the connection pads 415 etc.

The method of bonding the thermosensitive element 150 to the substrate 110a will be explained. First, the conductive bonding material 170 is for example coated on the connection pads 415 and mounting pads 417 by a dispenser. The thermosensitive element 150 is placed on the conductive bonding material 170. Then, the conductive bonding material 170 is melt-bonded by heating, the lower surfaces of the connection terminals 151 and the connection pads 415 are bonded, and the mounting pads 417 and the side surfaces of the connection terminals 151 of the thermosensitive element 150 are bonded. At this time, the conductive bonding material 170 is formed with an inclination, that is, fillet, so that the thickness gradually increases from the mounting pads 417 toward the side surfaces of the connection terminal 151 of the thermosensitive element 150. Accordingly, the thermosensitive element 150 is bonded to the pair of connection pads 415 and mounting pads 417.

The crystal unit in the present embodiment is provided with the rectangular substrate 110a, frame 110b (FIG. 1) which is provided on the upper surface of the substrate 110a, mounting frame 160 which is provided on the lower surface of the substrate 110a, joining terminals 112 which are provided along the outer circumferential edge of the lower surface of the substrate 110a, joining pads 161 (FIG. 1) which are provided along the outer circumferential edge of the upper surface of the mounting frame 160, a pair of electrode pads 111 which are provided on the upper surface of the substrate 110a inside the frame 110b, a pair of connection pads 415 which are provided on the lower surface of the substrate 110a within the mounting frame 160, a pair of mounting pads 417 which are electrically connected to the connection pads 415 and are provided on the lower surface of the substrate 110a, a crystal element 120 which mounted on the electrode pads 111, a thermosensitive element 150 which is mounted on the connection pads 415 and mounting pads 417 by the conductive bonding material 170, and a lid 130 (FIG. 1) which is bonded to the upper surface of the frame 110b, in which the joining terminals 112 and the joining pads 415 are electrically bonded. By configuring the unit in this way, in the crystal unit, the conductive bonding material 170 which bonds the thermosensitive element 150 is provided not only on the connection pads 415, but also on the mounting pads 417, therefore the amount of the conductive bonding material 170 can be secured, an inclination, that is, fillet, so that the thickness of the conductive bonding material 170 gradually increases from the mounting pads 417 toward the side surfaces of the connection terminals 151 of the thermosensitive element 150 is formed, therefore it becomes possible to improve the bonding strength between the conductive bonding material 170 and the thermosensitive element 150.

Fifth Embodiment

Figure 11A:
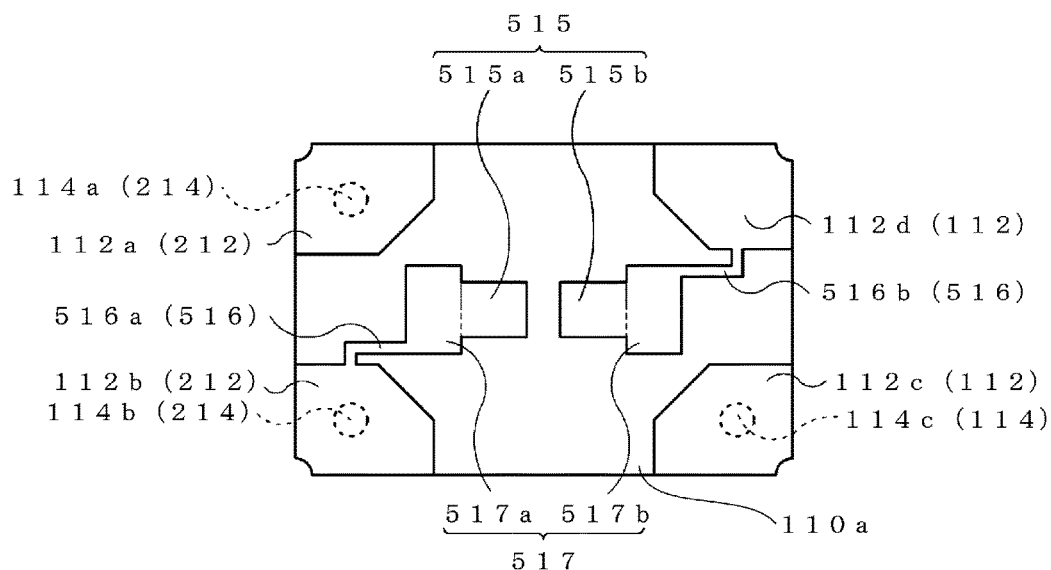
FIG. 11A is a planar transparent view when viewing a substrate of a package which configures a crystal unit according to a fifth embodiment from the bottom surface, and 11B is a planar transparent view when viewing the package which configures the crystal unit according to the fifth embodiment from the bottom surface.
Figure 11B:
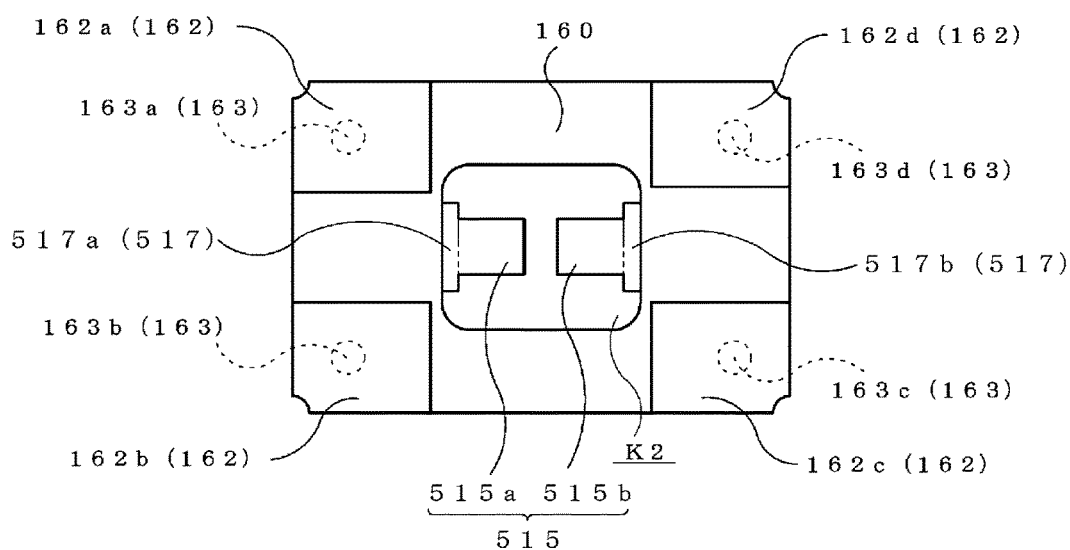
Figure 12:
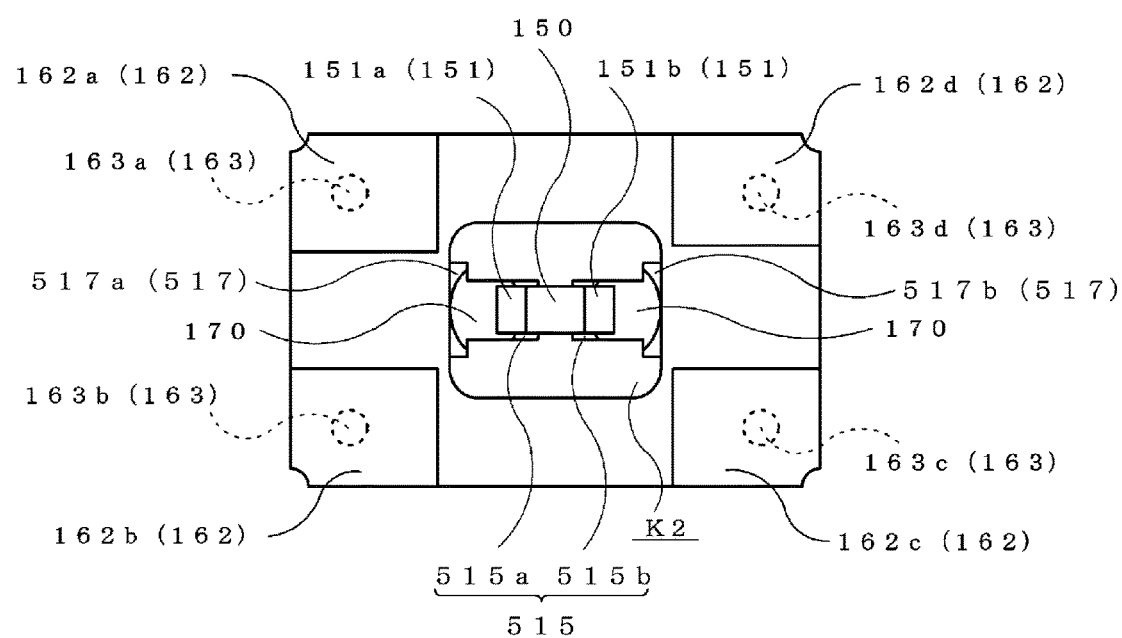
FIG. 12 is a plan view when viewing the crystal unit according to the fifth embodiment from the bottom surface.

A crystal unit in a fifth embodiment, as shown in FIGS. 11A and 11B and FIG. 12, has mounting pads 517 the same as the mounting pads 417 in the fourth embodiment. However, the present embodiment is different from the fourth embodiment at the point that the connection pads 515 and mounting pads 517 are rectangular in shape, and are provided so that the length of one side of a connection pad 515 which faces the center direction of the substrate 110a becomes shorter than the length of one side of a mounting pad 517 which faces a center direction of the substrate 110a.

The connection pads 515 are provided in a pair so as to be adjacent to each other near the center of the lower surface of the substrate 110a. Further, the connection pads 515 are configured by a first connection pad 515a and second connection pad 515b. The conductive bonding material 170 is provided between the lower surface of the connection pads 515 and the connection terminals 151 of the thermosensitive element 150.

The mounting pads 517 are rectangular in shape and are provided in order to mount the thermosensitive element 150 and secure the amount of the conductive bonding material 170. The mounting pads 517 are electrically connected to the connection pads 515 and are provided so as to be positioned nearer the short sides of the substrates 110a than the connection pads 515. The mounting pads 517 are configured by a first mounting pad 517a and second mounting pad 517b. Further, they are provided so that the length of one side of a mounting pad 517 which faces the center direction of the substrate 110a becomes longer than the length of one side of a connection pad 515 which faces the center direction of the substrate 110a. By configuring the unit in this way, the thermosensitive element 150 is bonded to the connection pads 515 and mounting pads 517 so that the conductive bonding material 170 becomes wider as going toward the mounting pads 517 from the connection pads 515 when viewed on a plane, therefore it becomes possible to further improve the bonding strength of the thermosensitive element 150. Note that, the connection patterns 516 (first connection pattern 516a and second connection pattern 516b) for example extend from the end parts of the long sides of the mounting pads 517.

Further, the second mounting pad 517b is provided so as to be positioned between a pair of electrode pads 111 (FIG. 1) when viewed on a plane and is provided so as to overlap a portion of the pair of electrode pads 111. Further, by configuring the unit in this way, heat which is transferred from the crystal element 120 is transferred from the electrode pads 111 to the second mounting pad 517b which is located just under the former and is transferred to the second connection pad 515b from the second mounting pad 517b. Accordingly, such a crystal unit can shorten the heat conduction path more, therefore the temperature of the crystal element 120 and the temperature of the thermosensitive element 150 become closer, and thus it becomes possible to further reduce the difference between the temperature which is obtained by converting the voltage which is output from the thermosensitive element 150 and the actual temperature around the crystal element 120.

Here, by taking as an example a case where the dimension of the long sides of the substrate 110a is 1.2 to 2.5 mm and the dimension of the short sides of the substrate 110a is 1.0 to 2.0 mm when viewed on a plane, sizes of the connection pads 515 and mounting pads 517 will be explained. The lengths of the sides of the connection pads 515 which are parallel to the short sides of the substrate 110a are 0.2 to 0.5 mm, and the lengths of the sides of the connection pads 515 which are parallel to the long sides of the substrate 110a becomes 0.25 to 0.55 mm. The lengths of the sides of the mounting pads 517 which are parallel to the short sides of the substrate 110a are 0.4 to 0.7 mm, and the lengths of the sides of the mounting pads 517 which are parallel to the long sides of the substrate 110a become 0.1 to 0.4 mm. In this way, the length of one side of a mounting pad 517 which faces the center direction of the substrate 110a becomes longer compared with the length of one side of a connection pad 515 which faces the center direction of the substrate 110a. Accordingly, the conductive bonding material 170 is bonded so that it becomes wider as going toward the mounting pads 517 from the connection pads 515 when viewed on a plane as shown in FIG. 12. Therefore, it becomes possible to further improve the bonding strength. Further, the length between the first connection pad 515a and the second connection pad 515b has become 0.1 to 0.3 mm.

In the crystal unit in the present embodiment, because the connection pads 515 and mounting pads 517 are rectangular in shape and they are provided so that the length of one side of a connection pad 515 which faces the center direction of the substrate 110a becomes shorter than the length of one side of a mounting pad 517 which faces the center direction of the substrate 110a, the thermosensitive element 150 is bonded to the connection pads 515 and mounting pads 517 so that the conductive bonding material 170 becomes wider as going toward the mounting pads 517 from the connection pads 515 when viewed on a plane, therefore it becomes possible to further improve the bonding strength of the thermosensitive element 150.

Further, in the crystal unit in the present embodiment, the second mounting pad 517b is provided so as to be positioned between a pair of electrode pads 111 when viewed on a plane and is provided so as to overlap a portion of the pair of electrode pads 111. Further, by configuring the unit in this way, heat which is transferred from the crystal element 120 is transferred from the electrode pads 111 to the second mounting pad 517b which is located just under the former and is transferred to the second connection pad 515b from the second mounting pad 517b. Accordingly, such a crystal unit can shorten the heat conduction path more, therefore the temperature of the crystal element 120 and the temperature of the thermosensitive element 150 become closer, and thus it becomes possible to further reduce the difference between the temperature which is obtained by converting the voltage which is output from the thermosensitive element 150 and the actual temperature around the crystal element 120.

Sixth Embodiment

Figure 13:
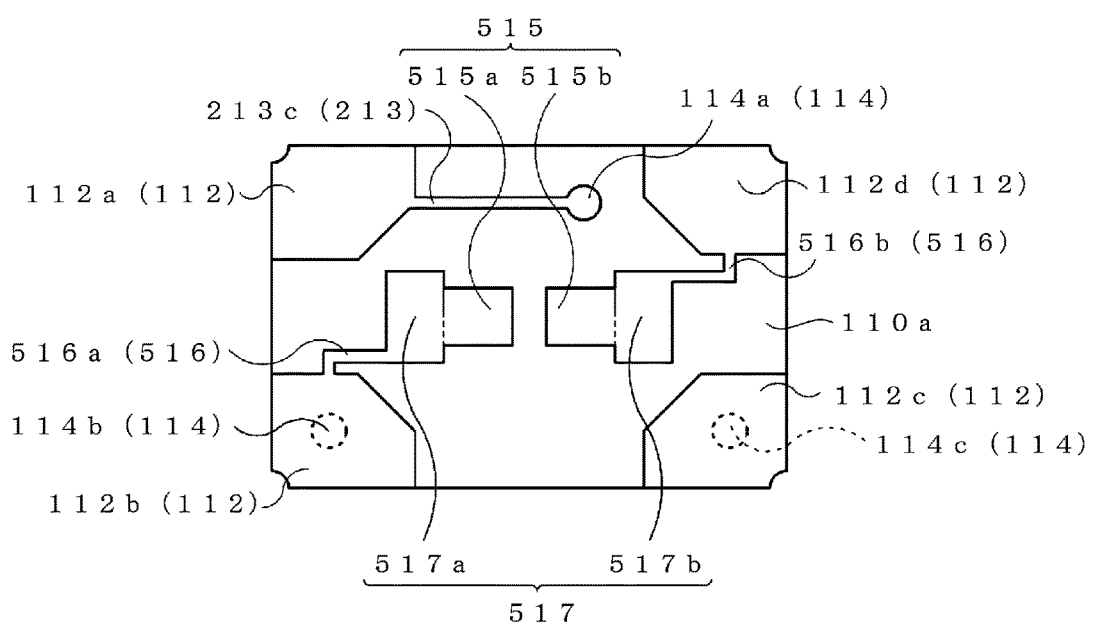
FIG. 13 is a planar transparent view when viewing a substrate of a package which configures a crystal unit according to a sixth embodiment from the bottom surface.

A crystal unit in a sixth embodiment is obtained by combining the second embodiment with the fifth embodiment as shown in FIG. 13. That is, the crystal unit in the present embodiment has mounting pads 517 in the same way as the fifth embodiment. Further, in the crystal unit of the present embodiment, in the same way as the second embodiment, one of the interconnect patterns 213 (third interconnect pattern 213c) for electrically connecting the electrode pads 111 (FIG. 1) and the joining terminals 112 is provided on the same plane as that for the connection pads 515 and is provided at the position where it overlaps the mounting frame 160. Note that, the planar transparent view when viewing the substrate 110a in the present embodiment from the top surface is the same as FIG. 6B. Further, the third interconnect pattern 213c overlaps the mounting frame 160, therefore the planar transparent view when viewing the package in the present embodiment from the bottom surface is the same as FIG. 11B.

Seventh Embodiment

Figure 14A:
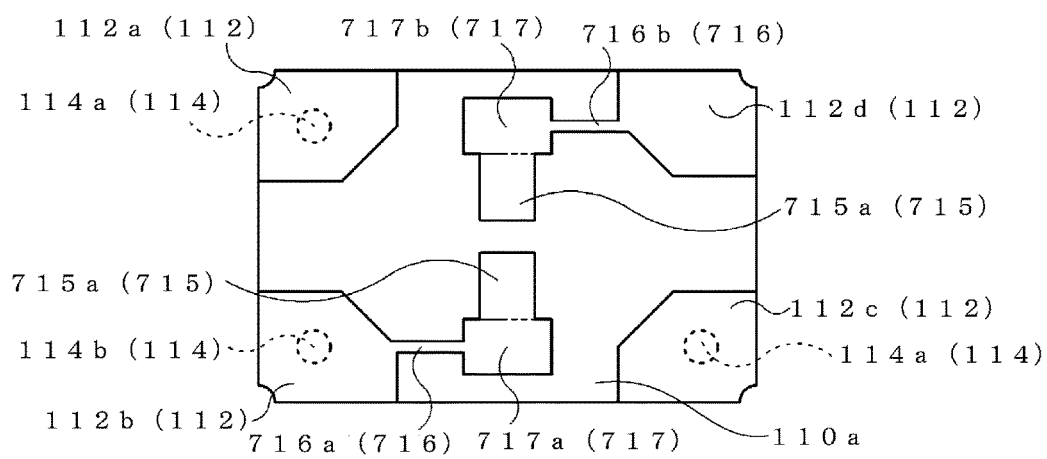
FIG. 14A is a planar transparent view when viewing a substrate of a package which configures a crystal unit according to a seventh embodiment from the bottom surface and 14B is a planar transparent view when viewing the package which configures the crystal unit according to the seventh embodiment from the bottom surface.
Figure 14B:
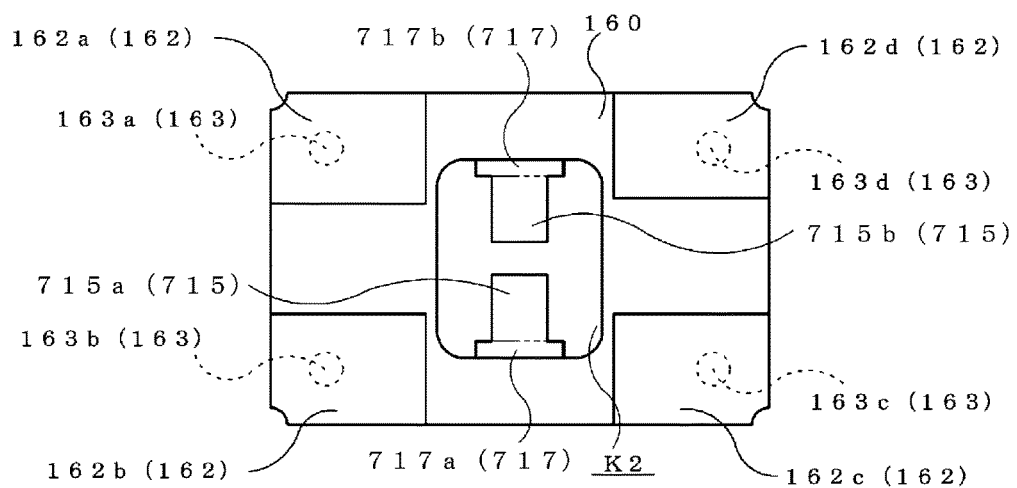
Figure 15:
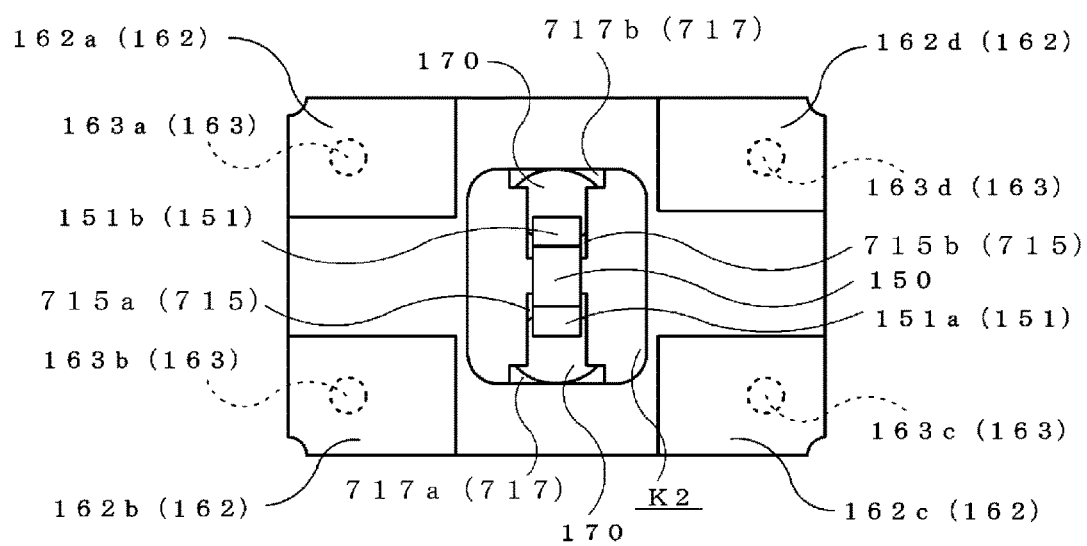
FIG. 15 is plan view when viewing the crystal unit according to the seventh embodiment from the bottom surface.
Figure 16:
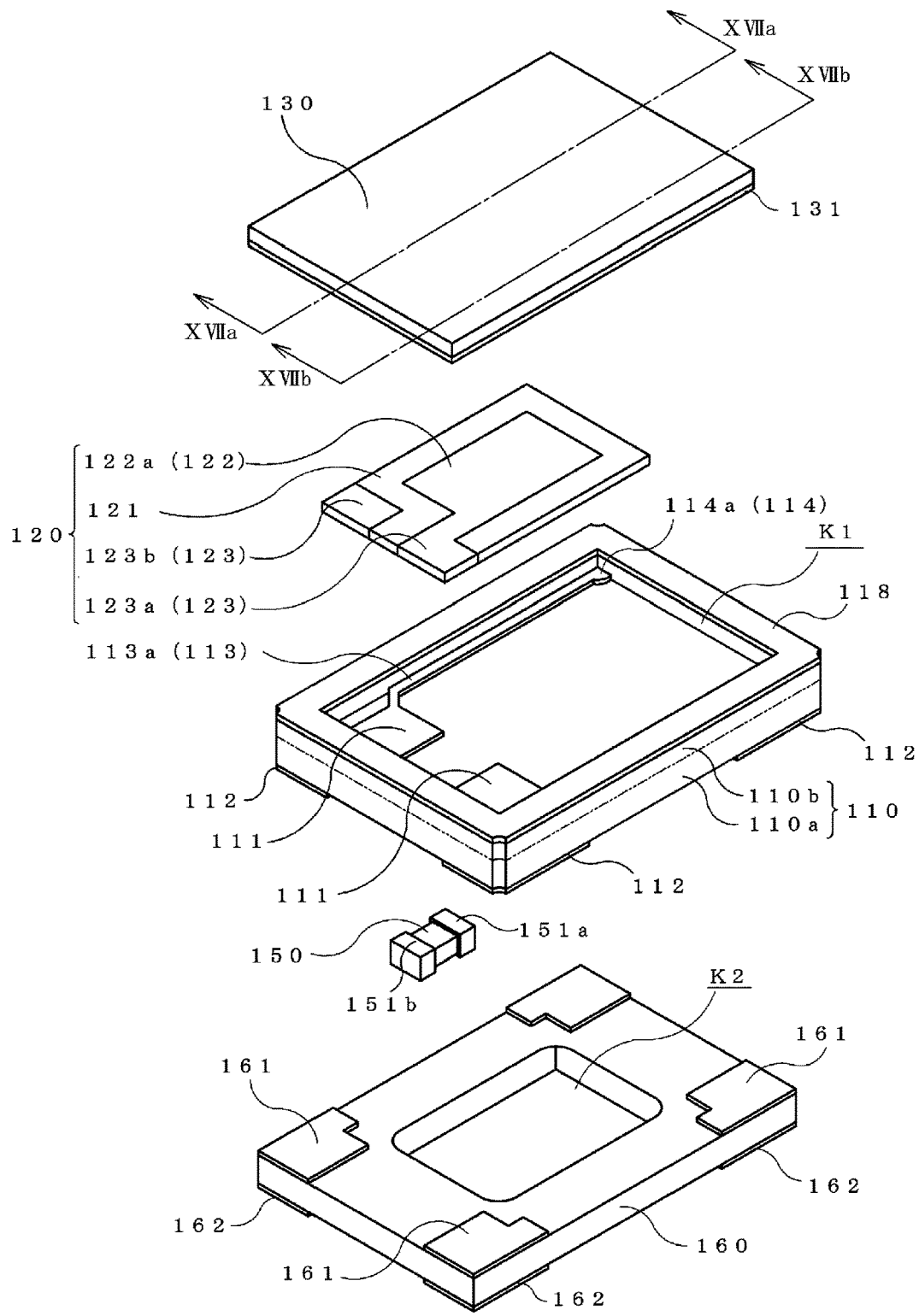
FIG. 16 is a disassembled perspective view which shows a crystal unit according to an eighth embodiment.
Figure 17A:
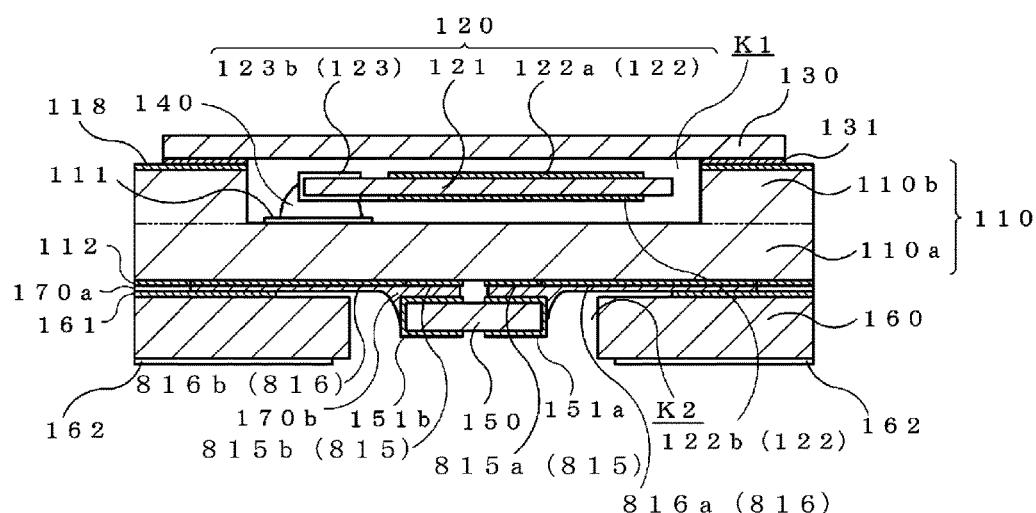
FIG. 17A is a cross-sectional view taken along XVIIa-XVIIa in FIGS. 16, and 17B is a cross-sectional view taken along XVIIb-XVIIb in FIG. 16.
Figure 17B:
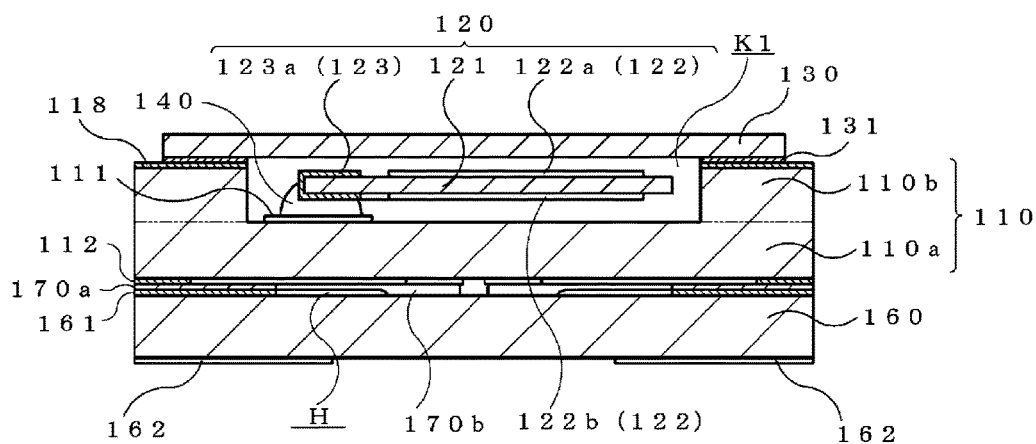

A crystal unit in a seventh embodiment is obtained by combining the third embodiment with the fifth embodiment as shown in FIGS. 14A and 14B and FIG. 15. That is, the crystal unit in the present embodiment has mounting pads 717 in the same way as the fifth embodiment. Further, in the crystal unit of the present embodiment, in the same way as the third embodiment, the thermosensitive element 150 is mounted on the connection pads 715 and mounting pads 717 of the substrate 110a so that its long sides become parallel to the short sides of the substrate 110a.

The connection pads 715 are rectangular in shape and are provided near the center of the lower surface of the substrate 110a. The connection pads 715 are provided so as to be adjacent to each other so that the long sides of the connection pads 715 and the short sides of the substrate 110a become parallel. The connection pads 715 are configured by a first connection pad 715a and second connection pad 715b.

The mounting pads 717 are rectangular in shape and are electrically connected to the connection pads 715. Further, the mounting pads 717 are provided so as to be positioned nearer the long sides of the substrate 110a than the connection pads 715. In the conductive bonding material 170, an inclination, that is, fillet, is formed so that the thickness gradually increases from the mounting pads 717 toward the side surfaces of the connection terminals 151 of the thermosensitive element 150. By configuring the unit in this way, the thermosensitive element 150 can improve the bonding strength with the connection pads 715 and mounting pads 717.

Further, the second mounting pad 717b, when viewed on a plane, is provided at a position where it overlaps the first interconnect pattern 113a as shown in FIGS. 3A and 3B and FIGS. 14A and 14B. By configuring the unit in this way, heat which is transferred from the crystal element 120 is transferred from the first electrode pad 111a to the first interconnect pattern 113a and is transferred through the substrate 110a which is located just under the first interconnect pattern 113a to the second mounting pad 717b and further to the second connection pad 715b. Accordingly, such a crystal unit can further shorten the heat conduction path, therefore the temperature of the crystal element 120 and the temperature of the thermosensitive element 150 become closer, and thus it becomes possible to further reduce the difference between the temperature which is obtained by converting the voltage which is output from the thermosensitive element 150 and the actual temperature around the crystal element 120.

The connection patterns 716 are, as shown in FIG. 14A, provided on the lower surface of the substrate 110a and are led out from the mounting pads 717 toward the nearly joining terminals 112. Further, a second connection pattern 716b is provided so as to overlap the first interconnect pattern 113a. By configuring the unit in this way, heat which is transferred from the crystal element 120 is transferred from the first electrode pad 111a to the first interconnect pattern 113a and is transferred, through the substrate 110a which is located just under the first interconnect pattern 113a, from the second connection pattern 716b to the second mounting pad 717b and second connection pad 715b. Accordingly, such a crystal unit can further shorten the heat conduction path, therefore the temperature of the crystal element 120 and the temperature of the thermosensitive element 150 become closer, and thus it becomes possible to further reduce the difference between the temperature which is obtained by converting the voltage which is output from the thermosensitive element 150 and the actual temperature around the crystal element 120.

Here, by taking as an example a case where the dimension of the long sides of the substrate 110a is 1.2 to 2.5 mm, and the dimension of the short sides of the substrate is 1.0 to 2.0 mm when viewed on a plane, sizes of the connection pads 715 and mounting pads 717 will be explained. The lengths of the sides of the connection pads 715 which are parallel to the long sides of the substrate 110a are 0.2 to 0.5 mm, and the lengths of the sides of the connection pads 715 which are parallel to the short sides of the substrate 110a become 0.25 to 0.55 mm. The lengths of the sides of the mounting pads 717 which are parallel to the long sides of the substrate 110a are 0.4 to 0.7 mm, and the lengths of the sides of the mounting pads 717 which are parallel to the short sides of the substrate 110a become 0.1 to 0.4 mm. In this way, the length of one side of a mounting pad 717 which faces the center direction of the substrate 110a becomes longer compared with the length of one side of a connection pad 715 which faces the center direction of the substrate 110a. Accordingly, the conductive bonding material 170 is bonded so that it becomes wider as going toward the mounting pads 717 from the connection pads 715 as shown in FIG. 15 when viewed on a plane. Therefore, it becomes possible to further improve the bonding strength. Further, the length between the first connection pad 715a and the second connection pad 715b has become 0.1 to 0.3 mm.

Eighth Embodiment

A crystal unit in an eighth embodiment differs from the first embodiment in the point that, as shown in FIG. 16 to FIGS. 20A and 20B, a first conductive bonding material 170a and second conductive bonding material 170b are bonded. Note that, the shape of the external terminals 162 etc. are different from those in the first embodiment, but the same notations will be attached and explanations will be omitted.

Figure 18A:
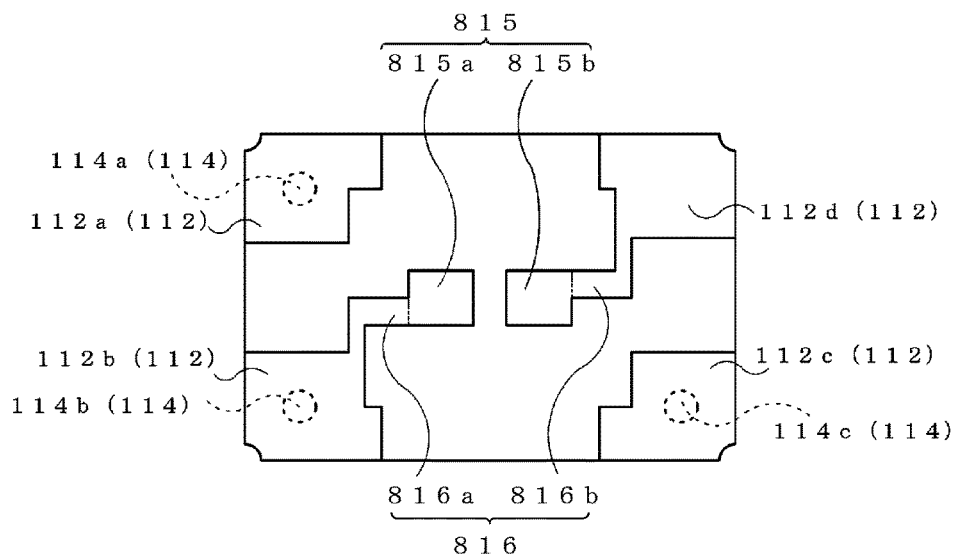
FIG. 18A is a transparent plan view when viewing a substrate of a package which configures the crystal unit according to the eighth embodiment from the bottom surface, and 18B is a transparent plan view when viewing the package which configures the crystal unit according to the eighth embodiment from the bottom surface.
Figure 18B:
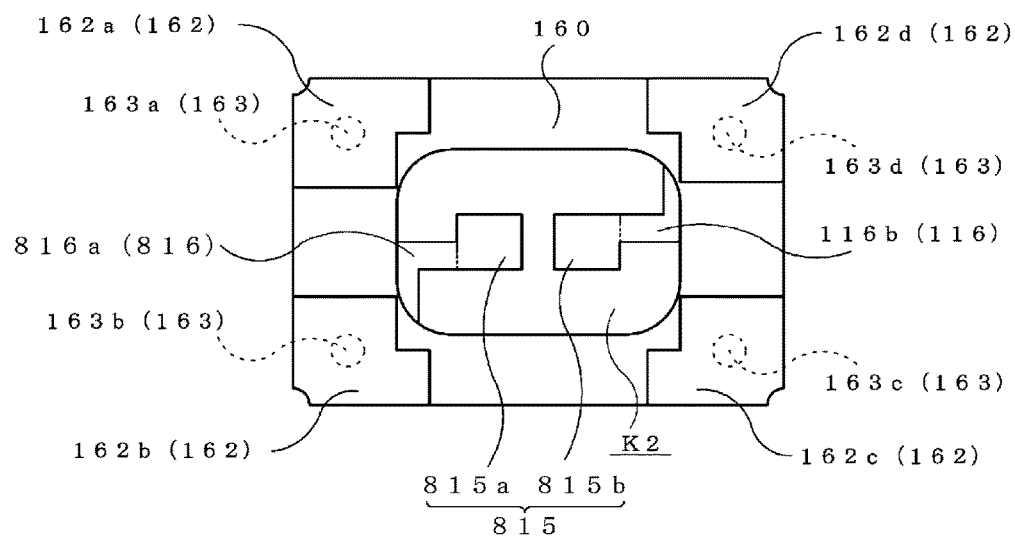
Figure 19A:
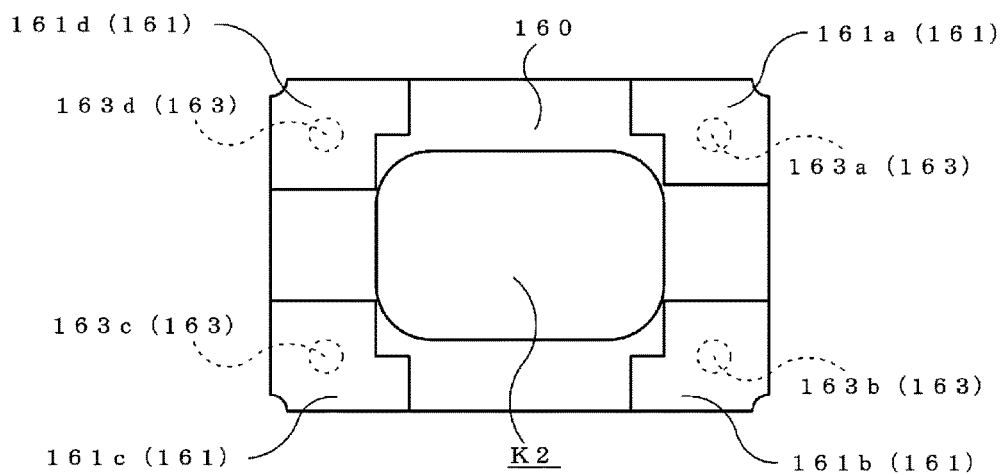
FIG. 19A is a transparent plan view when viewing a mounting frame which configures the crystal unit according to the eighth embodiment from the upper surface, and 19B is a transparent plan view when viewing the mounting frame which configures the crystal unit according to the eighth embodiment from the bottom surface.
Figure 19B:
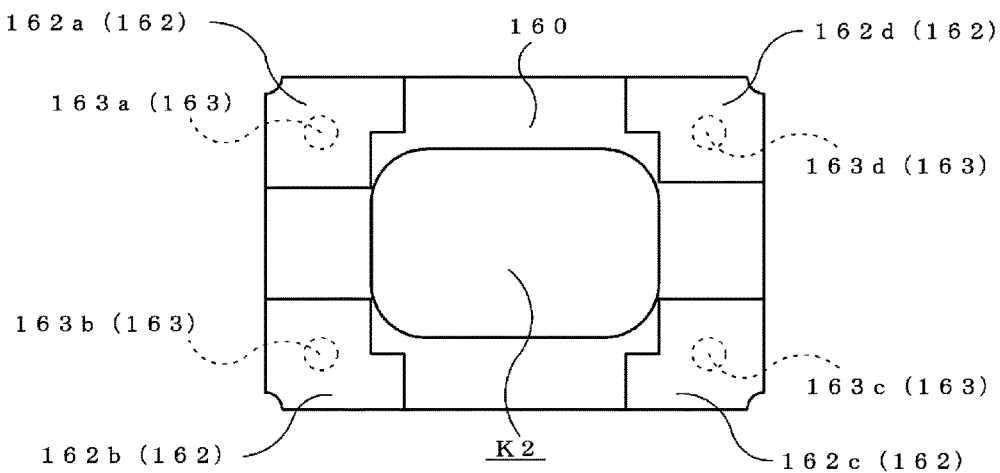

The connection pads 815 are rectangular in shape and are used for mounting the thermosensitive element 150. Further, the connection pads 815, as shown in FIGS. 18A and 18B, are configured by a first connection pad 815a and second connection pad 815b. The second conductive bonding material 170b is provided between the lower surface of the connection pads 815 and the connection terminals 151 of the thermosensitive element 150.

Here, by taking as an example a case where the dimension of the long sides of the substrate 110a is 1.2 to 2.5 mm, and the dimension of the short sides of the substrate 110a is 1.0 to 2.0 mm when viewed on a plane, the size of the connection pads 815 will be explained. The lengths of the sides of the connection pads 815 which are parallel to the short sides of the substrate 110a are 0.2 to 0.5 mm, and the lengths of the sides of the connection pads 815 which are parallel to the long sides of the substrate 110a become 0.25 to 0.55 mm. Further, the length between the first connection pad 815a and the second connection pad 815b has become 0.1 to 0.3 mm.

The first connection pad 815a and the second joining terminal 112b are connected by a first connection pattern 816a which is provided on the lower surface of the substrate 110a. Further, the second connection pad 815b and the fourth joining terminal 112d are connected by a second connection pattern 816b which is provided on the lower surface of the substrate 110a.

Figure 20A:
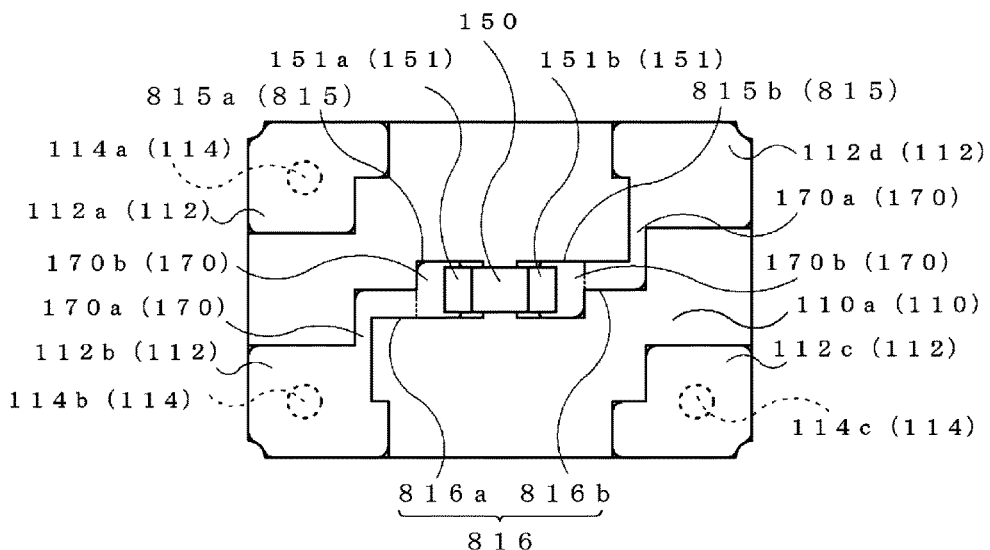
FIG. 20A is a plan view viewed from the bottom surface in a state where the mounting frame of the crystal unit according to the eighth embodiment is detached, and 20B is a plan view when viewing the crystal unit according to the eighth embodiment from the bottom surface.
Figure 20B:
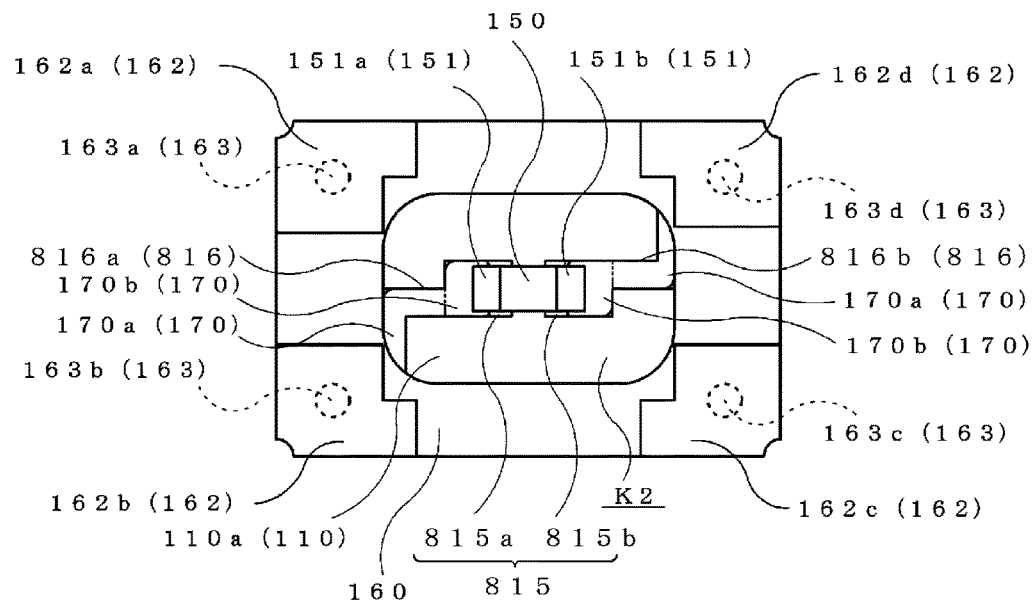

At the connection patterns 816, the second conductive bonding material 170b which bonds the thermosensitive element 150 to the connection pads 815 flows. At the same time, the first conductive bonding material 170a which bonds the mounting frame 160 to the joining terminals 112 which are provided on the lower surface of the substrate 110a flows. Due to this, as shown in FIG. 20A, the first conductive bonding material 170a and the second conductive bonding material 170b are bonded on the connection patterns 816. Accordingly, the thermosensitive element 150 is bonded to the connection pads 815, connection patterns 816, and joining terminals 112 through the first conductive bonding material 170a and second conductive bonding material 170b. Therefore, compared with the conventional crystal unit, the bonding area of the thermosensitive element 150 can be made larger, and thus the bonding strength between the thermosensitive element 150 and the package 110 can be improved. In the same way, the mounting frame 160 is bonded to the joining terminals 112, connection patterns 816, and connection pads 815 through the first conductive bonding material 170a and second conductive bonding material 170b, therefore the bonding strength between the mounting frame 160 and the package 110 can be improved.

Further, the second connection pattern 816b, as shown in FIGS. 3A and 3B and FIGS. 18A and 18B, is provided so as to be positioned between a pair of electrode pads 111 when viewed on a plane. Further, a portion of the second connection pattern 816b is provided so as to overlap the first electrode pad 111a when viewed on a plane. Accordingly, as explained in the first embodiment and fourth embodiment, it becomes possible to further reduce the difference between the temperature which is obtained by converting the voltage which is output from the thermosensitive e element 150 and the actual temperature around the crystal element 120.

The bonding method of the mounting frame 160 to the substrate 110a will be explained. First, the first conductive bonding material 170a is for example coated on the first joining pad 161a, second joining pad 161b, third joining pad 161c, and fourth joining pad 161d by a dispenser or screen printing. The substrate 110a is conveyed so that the joining terminals 112 of the substrate 110a are positioned above the first conductive bonding material 170a which is coated on the joining pads 161 of the mounting frame 160 and then is placed on the first conductive bonding material 170a. Due to this, by thermally melting the first conductive bonding material 170a, the joining terminals 112 of the substrate 110a are bonded to the joining pads 161. That is, the first joining terminal 112a of the substrate 110a is bonded to the first joining pad 161a, and the second joining terminal 112b of the substrate 110a is bonded to the second joining pad 161b. Further, the third joining terminal 112c of the substrate 110a is bonded to the third joining pad 161c, and the fourth joining terminal 112d of the substrate 110a is bonded to the fourth joining pad 161d. Further, the first conductive bonding material 170a, by thermally melting, overflows onto the connection patterns 816 having a better wettability than the ceramic material of the substrate 110a and is bonded to the second conductive bonding material 170b on the connection patterns 816 by cooling and solidification.

The thermosensitive element 150, as shown in FIGS. 17A and 17B and FIGS. 20A and 20B, is mounted on the connection pads 815, connection patterns 816, and joining terminals 112 which are provided on the lower surface of the substrate 110a through the first conductive bonding material 170a and the second conductive bonding material 170b such as solder.

The bonding method of the thermosensitive element 150 to the substrate 110a will be explained. First, the second conductive bonding material 170b is for example coated on the connection pads 815 by a dispenser. The thermosensitive element 150 is placed on the second conductive bonding material 170b which is coated on the connection pads 815 of the substrate 110a. Then, the second conductive bonding material 170b is melt-bonded by heating, overflows onto the connection patterns 816 having a better wettability than the ceramic material of the substrate 110a, and is bonded to the first conductive bonding materials 170a on the connection patterns 816 which overflowed from the joining terminals 112 which are provided on the lower surface of the substrate 110a. Accordingly, the thermosensitive element 150 is bonded to a pair of connection pads 815, connection patterns 816, and joining terminals 112 through the first conductive bonding material 170a and second conductive bonding material 170b.

The crystal unit in the embodiment of the present invention is provided with the rectangular substrate 110a, frame 110b which is provided on the upper surface of the substrate 110a, mounting frame 160 which is provided on the lower surface of the substrate 110a, a pair of electrode pads 111 which are provided on the upper surface of the substrate 110a inside the frame 110b, a pair of connection pads 815 which are provided on the lower surface of the substrate 110a inside the mounting frame 160, joining terminals 112 which are provided along the outer circumferential edge of the lower surface of the substrate 110a, joining pads 161 which are provided along the outer circumferential edge of the upper surface of the mounting frame 160 and bonded to the joining terminals 112 through the first conductive bonding material 170a, a crystal element 120 which is mounted on the electrode pads 111, a thermosensitive element 150 which is mounted on the connection pads 815 through the second conductive bonding material 170b, and a lid 130 which bonded to the upper surface of the frame 110b, in which the first conductive bonding material 170a and second conductive bonding material 170b are bonded. By configuring the unit in this way, in the crystal unit, the first conductive bonding material 170a which bonds the mounting frame 160 and the second conductive bonding material 170b which bonds the thermosensitive element 150 are bonded, therefore the amount by adding the first conductive bonding material 170a and second conductive bonding material 170b can be secured, therefore it becomes possible to improve the bonding strength of the thermosensitive element 150 with the first conductive bonding material 170a and second conductive bonding material 170b.

Ninth Embodiment

Figure 21:
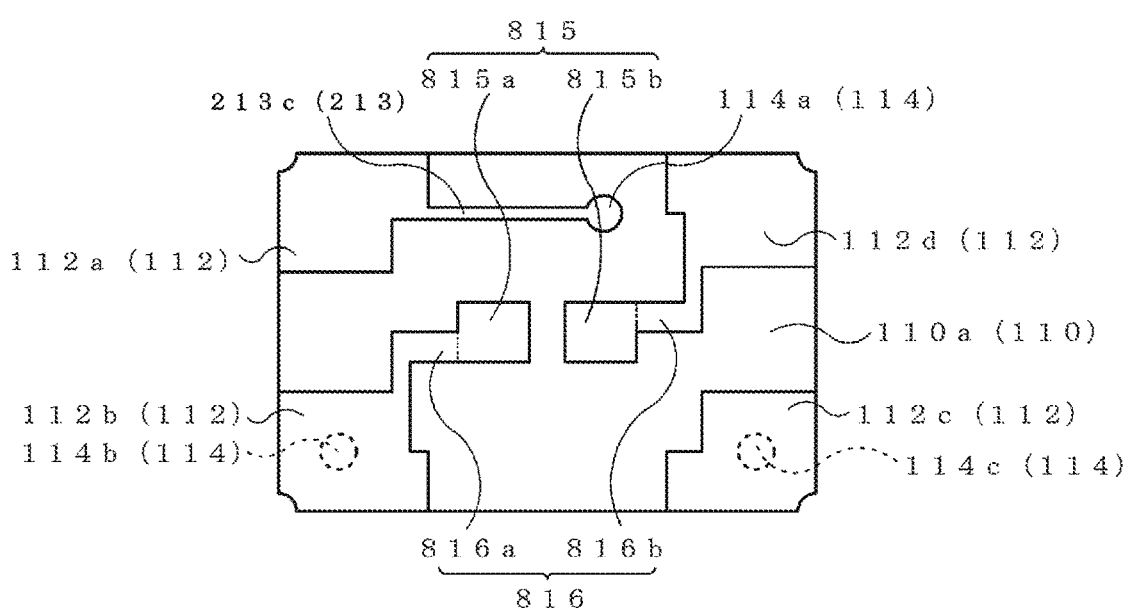
FIG. 21 is a transparent plan view when viewing a substrate of a package which configures a crystal unit according to a ninth embodiment from the bottom surface.

A crystal unit in the present embodiment is combines the second embodiment with the eighth embodiment as shown in FIG. 21. That is, one of the interconnect patterns 213 (third interconnect pattern 213c) is provided on the same plane as that for the connection pads 815 and is provided at a position where it overlaps the mounting frame 160. Note that, since the third interconnect pattern 213c overlaps the mounting frame 160, the planar transparent view when viewing the package in the present embodiment from the bottom surface is the same as FIG. 18B.

10th Embodiment

A crystal element in the present embodiment, as shown in FIGS. 22A and 22B and FIGS. 23A and 23B, combines the third embodiment with the eighth embodiment. That is, the crystal unit in the present embodiment is configured so that, in the same way as the eighth embodiment, the first conductive bonding material 170a and second conductive bonding material 170b are bonded, and the thermosensitive element 150 is mounted on connection pads 1015 of the substrate 110a so that its long sides become parallel to the short sides of the substrate 110a.

Figure 22A:
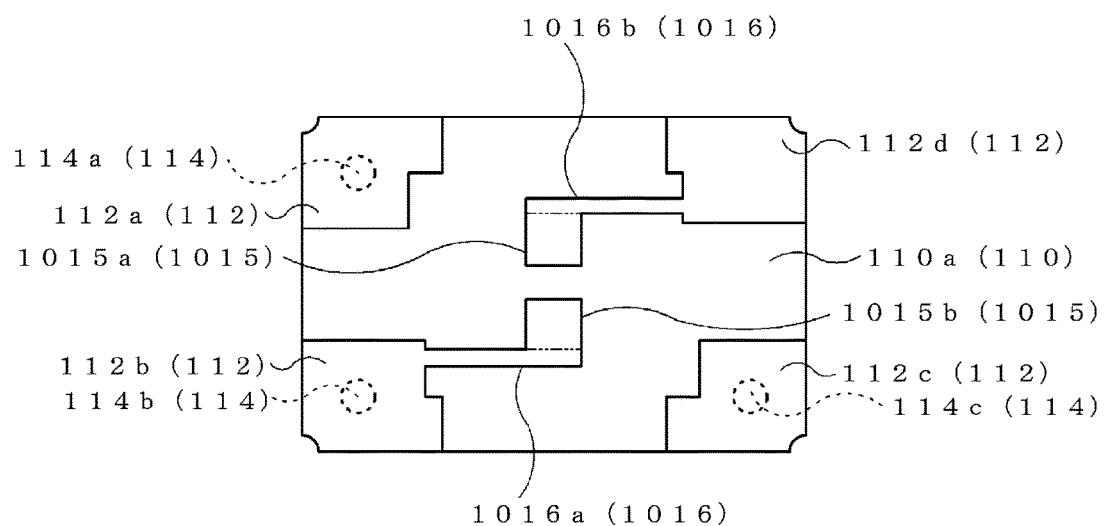
FIG. 22A is a transparent plan view when viewing a substrate of a package which configures a crystal unit according to a 10th embodiment from the bottom surface, and 22B is a transparent plan view when viewing the package which configures the crystal unit according to the 10th embodiment from the bottom surface.
Figure 22B:
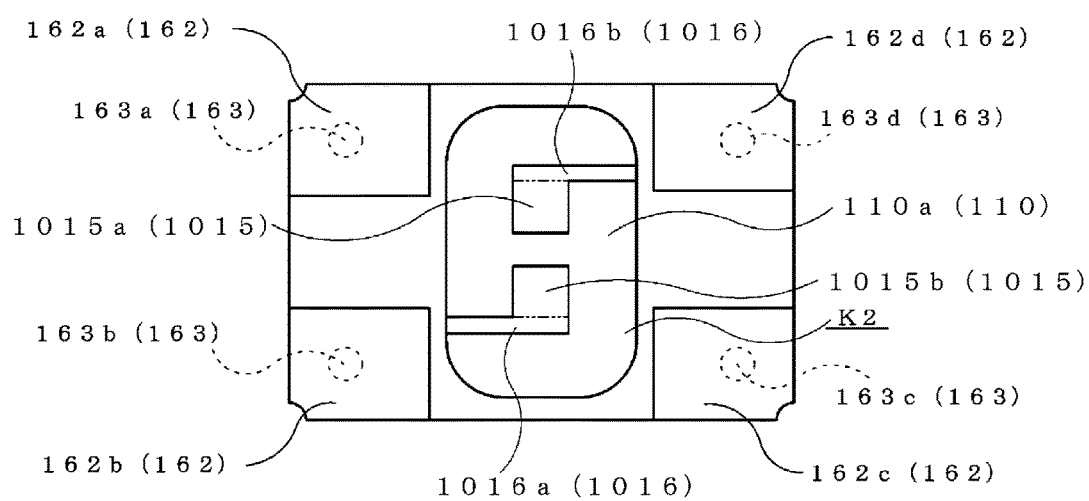
Figure 23A:
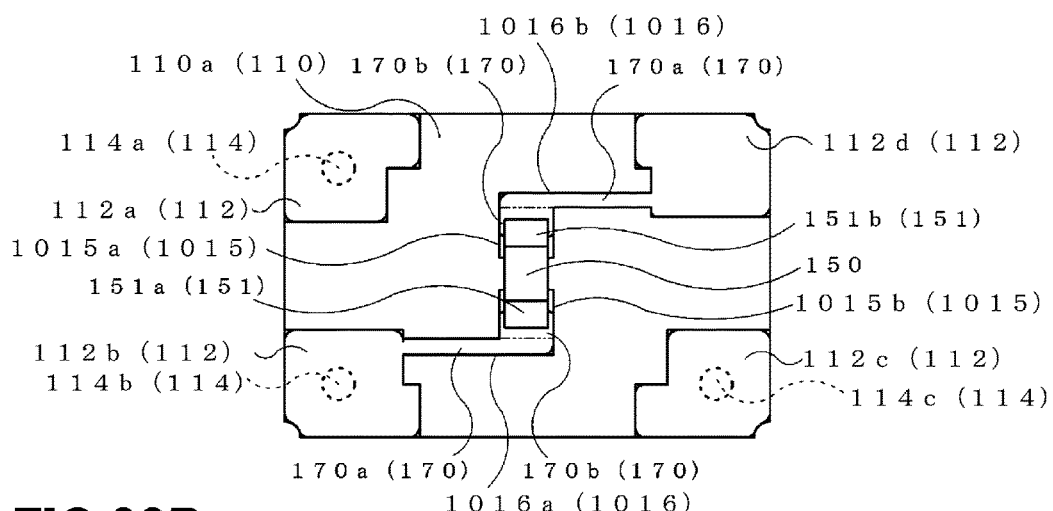
FIG. 23A is a plan view viewed from the bottom surface in a state where a mounting frame of the crystal unit according to the 10th embodiment is detached, and 23B is a plan view when viewing the crystal unit according to the 10th embodiment from the bottom surface.
Figure 23B:
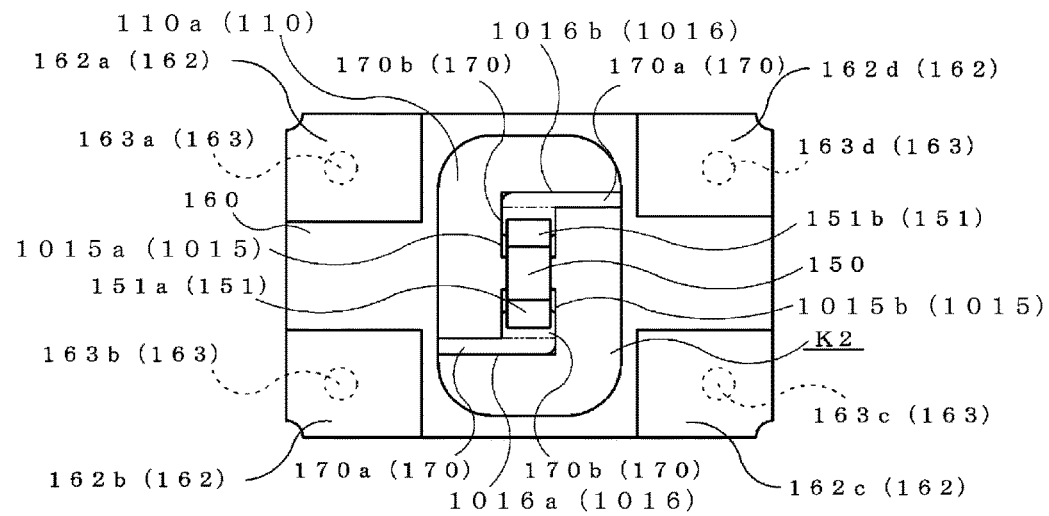

The connection pads 1015 are rectangular in shape and are provided near the center on the lower surface of the substrate 110a. The connection pads 1015, as shown in FIGS. 22A and 22B, are provided to be adjacent to each other so that the long sides of the connection pads 1015 and the short sides of the substrate 110a become parallel. The connection pads 1015 are configured by a first connection pad 1015a and second connection pad 1015b.

The connection patterns 1016 (first connection pattern 1016a and second connection pattern 1016b), as shown in FIG. 22A, are provided on the lower surface of the substrate 110a and are led out from the connection pads 1015 toward the nearby joining terminal 112. Further, the second connection pattern 1016b is provided so as to overlap the first interconnect pattern 113a (FIGS. 3A and 3B).

Here, by taking as an example a case where the dimension of the long sides of the substrate 110a is 1.2 to 2.5 mm, and the dimension of the short sides of the substrate 110a is 1.0 to 2.0 mm when viewed on a plane, the size of the connection pad 1015 will be explained. The lengths of the sides of the connection pads 1015 which are parallel to the long sides of the substrate 110a are 0.2 to 0.5 mm, and the lengths of the sides of the connection pads 1015 which are parallel to the short sides of the substrate 110a become 0.25 to 0.55 mm. Further, the length between the first connection pad 1015a and the second connection pad 1015b becomes 0.1 to 0.3 mm.

Note that, the invention is not limited to the present embodiments. Various alterations and modifications are possible insofar as they are within a range not out of the gist of the present invention. In the embodiments described above, cases where AT-use crystal elements were used as the crystal elements were explained, but use may be made of a tuning fork type flexural crystal having a base portion and two flat plate-shaped vibrating arm portions which extend from the side surfaces of the base portion in the same direction.

Further, a beveling method of the crystal element 120 will be explained. An abrasive material which is provided with media and abrasive grains and has predetermined grain size, and a crystal element plate 121 formed in a predetermined size are prepared. The prepared abrasive material and crystal element plate 121 are put into a cylindrical body, and an opening end part of the cylindrical body is closed by a cover. When the cylindrical body in which the abrasive material and crystal element plate 121 are put is rotated using the center axis of the cylindrical body as the center of rotation, the crystal element plate 121 is polished by the abrasive material and thus the beveling is carried out.

In the embodiments described above, cases where the frame 110*b* was integrally formed by a ceramic material in the same way as the substrate 110*a* were explained, but the frame 110*b* may be made of metal. In this case, the frame is bonded to the conductive film of the substrate through a silver-copper or other brazing material.

Further, in the embodiments described above, cases where the conductors 163 were provided inside the substrate were explained, but they may also be provided inside notches which are provided at corner portions of the mounting frame 160. At this time, the conductors are provided by printing a conductor paste in the notches.

Priorities are claimed on Japanese applications No. 2013-229076 filed on Nov. 5, 2013, No. 2014-91258 filed on Apr. 25, 2014 and No. 2014-109212 filed on May 27, 2014, the contents of which are incorporated herein by reference.

REFERENCE SIGNS LIST

110 . . . package
110*a* . . . substrate
110*b* . . . frame
111 . . . electrode pad
112 . . . joining terminal
113 . . . interconnect pattern
114 . . . via conductor
115, 315, 415, 515, 715, 815, 1015 . . . connection pads
116, 316, 416, 516, 716, 816, 1016 . . . connection patterns
118 . . . sealing conductor pattern
120 . . . crystal element
121 . . . crystal element plate
122 . . . excitation-use electrode
123 . . . leadout electrode
130 . . . lid
131 . . . sealing member
140 . . . conductive adhesive
150 . . . thermosensitive element
151 . . . connection terminal
160 . . . mounting frame
161 . . . joining pad
162 . . . external terminal
163 . . . conductor
K1 . . . first concave portion
K2 . . . second concave portion
H . . . clearance portion

The invention claimed is:
1. A crystal unit comprising:
a rectangular substrate,
a frame which is provided on an upper surface of the substrate,
a mounting frame which is provided on a lower surface of the substrate by joining of joining pads which are provided along the outer circumferential edge of its upper surface with joining terminals which provided along the outer circumferential edge of the lower surface of the substrate,
a crystal element which is mounted on electrode pads which are provided on the upper surface of the substrate in a region surrounded by the frame,
a thermosensitive element which is mounted on connection pads which are provided on the lower surface of the substrate in a region surrounded by the mounting frame,
a lid which is joined to the upper surface of the frame, and
first external terminals which are provided on the lower surface of the mounting frame and are electrically connected to the electrode pads through the joining terminals and the joining pads,
wherein the electrode pads are not electrically connected to the connection pads,
wherein the crystal unit is not provided with an IC,
wherein the mounting frame is made of an insulator, and
wherein a clearance portion is provided between the substrate and the mounting frame, the clearance portion being configured to permit air to flow from inside of the mounting frame to outside of the mounting frame.

2. The crystal unit according to claim 1, wherein, in a state where the crystal element and the thermosensitive element are mounted on the substrate, the thermosensitive element is positioned within the plane for the excitation-use electrodes which are provided on the crystal element when viewed on a plane.

3. The crystal unit according to claim 1, further comprising:
a connection pattern for electrically connecting one of the connection pads and one of the joining terminals, wherein
the electrode pads are provided in a pair so as to be adjacent to each other along one side of the inner circumferential edge of the frame, and
the connection pattern is positioned between the pair of electrode pads when viewed on a plane.

4. The crystal unit according to claim 1, further comprising:
an interconnect pattern for electrically connecting one of the electrode pads and one of the joining terminals, wherein
the interconnect pattern is provided on the same plane as that for the connection pad and is provided at a position which overlaps the mounting frame.

5. The crystal unit according to claim 1, further comprising:
a mounting pad which is electrically connected to one of the connection pads and is provided on the lower surface of the substrate, wherein
the thermosensitive element is mounted on said one of the connection pads and the mounting pad by a conductive bonding material, and
the joining terminals and the joining pads are electrically bonded.

6. The crystal unit according to claim 5, wherein:
said one of the connection pads and the mounting pad are rectangular in shape, and
the length of one side of said one of the connection pads which faces the center direction of the substrate is shorter than the length of one side of the mounting pad which faces the center direction of the substrate.

7. The crystal unit according to claim 5, wherein:
the electrode pads are provided in a pair so as to be adjacent to each other along one side of the inner circumferential edge of the frame, and
the mounting pad is positioned between the pair of electrode pads when viewed on a plane.

8. The crystal unit according to claim 1, further comprising:
a first conductive bonding material which connects one of the joining terminals and one of the joining pads, and
a second conductive bonding material which bonds one of the connection pads and the thermosensitive element, wherein
the first conductive bonding material and the second conductive bonding material are bonded.

9. The crystal unit according to claim 1, further comprising:
second external terminals which are provided on the lower surface of the mounting frame and are electrically connected to the connection pads through some of the joining terminals and the joining pads which are not electrically connected to the electrode pads, wherein connection conductors connecting the connection pads and the joining terminals are not provided inside of the substrate, but provided only on lower surface of the substrate.

* * * * *